(12) United States Patent
Mori et al.

(10) Patent No.: US 12,058,936 B2
(45) Date of Patent: Aug. 6, 2024

(54) THERMOELECTRIC MATERIAL, METHOD FOR PRODUCING SAME, AND THERMOELECTRIC POWER GENERATION ELEMENT

(71) Applicant: National Institute for Materials Science, Tsukuba (JP)

(72) Inventors: Takao Mori, Tsukuba (JP); Zihang Liu, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 18/025,608

(22) PCT Filed: Aug. 25, 2021

(86) PCT No.: PCT/JP2021/031156
§ 371 (c)(1),
(2) Date: Mar. 9, 2023

(87) PCT Pub. No.: WO2022/054577
PCT Pub. Date: Mar. 17, 2022

(65) Prior Publication Data
US 2023/0371382 A1 Nov. 16, 2023

(51) Int. Cl.
*H10N 10/853* (2023.01)
*B22F 1/10* (2022.01)
(Continued)

(52) U.S. Cl.
CPC ............. *H10N 10/853* (2023.02); *B22F 1/10* (2022.01); *B22F 3/105* (2013.01); *B22F 9/04* (2013.01);
(Continued)

(58) Field of Classification Search
None
See application file for complete search history.

(56) References Cited

U.S. PATENT DOCUMENTS 6,225,550 B1 5/2001 Hornbostel et al.
2013/0299754 A1 11/2013 Hwang et al.
(Continued)

FOREIGN PATENT DOCUMENTS

CN 112624063 A 4/2021
EP 3179526 6/2017
(Continued)

OTHER PUBLICATIONS

Gorai et al. J. Mater. Chem. A, 2018, 6, 13806-13815. (Year: 2018).*

(Continued)

*Primary Examiner* — Eli S Mekhlin
(74) *Attorney, Agent, or Firm* — Trojan Law Offices

(57) ABSTRACT

Provided is a thermoelectric material which exhibits excellent thermoelectric characteristics at room temperature; a method for producing this thermoelectric material; and a thermoelectric power generation element using this thermoelectric material. In an embodiment of the present invention, a thermoelectric material contains an inorganic compound that contains magnesium (Mg), antimony (Sb) and/or bismuth (Bi), copper (Cu), and if necessary M (M is composed of at least one element that is selected from the group consisting of selenium (Se) and tellurium (Te)); and inorganic compound is represented by $Mg_aSb_{2-b-c}Bi_bM_cCu_d$, wherein a, b, c and d satisfy $3 \leq a \leq 3.5$, $0 \leq b \leq 2$, $0 \leq c \leq 0.06$, $0 \leq d \leq 0.1$, and $(b+1) \leq 2$.

19 Claims, 17 Drawing Sheets

(51) Int. Cl.
- B22F 3/105 (2006.01)
- B22F 9/04 (2006.01)
- C22C 1/04 (2023.01)
- C22C 23/00 (2006.01)
- H10N 10/01 (2023.01)
- H10N 10/17 (2023.01)

(52) U.S. Cl.
CPC ............ *C22C 1/0408* (2013.01); *C22C 23/00* (2013.01); *H10N 10/01* (2023.02); *H10N 10/17* (2023.02); *B22F 2202/13* (2013.01); *B22F 2301/058* (2013.01); *B22F 2998/10* (2013.01); *B22F 2999/00* (2013.01)

(56) References Cited

U.S. PATENT DOCUMENTS

| | | | |
|---|---|---|---|
| 2018/0323360 A1 | 11/2018 | Kanno et al. | |
| 2020/0006616 A1* | 1/2020 | Uehara | H10N 10/17 |
| 2020/0123637 A1 | 4/2020 | Wu et al. | |

FOREIGN PATENT DOCUMENTS

| | | |
|---|---|---|
| JP | A2018-190953 | 11/2018 |
| JP | A2019-207983 | 12/2019 |
| JP | A2020-065035 | 4/2020 |
| WO | WO2020/003554 | 2/2020 |
| WO | 2020168531 A1 | 8/2020 |

OTHER PUBLICATIONS

Jun Mao, et al., "Manipulation of ionized impurity scattering for achieving high thermoelectric performance in n-type Mg3Sb2-based materials," PNAS, 114(40), p. 10548-20553, Sep. 18, 2017; http://doi.org/10.1073/pnas.1711725114.

Zihang Liu, et al., "Demonstration of ultrahigh thermoelectric efficiency of +/−7.3% in Mg3Sb2/MgAgSb module for low-temperature energy harvesting," Joule, vol. 5, p. 1196-1208, May 18, 2021; https://doi.org/10.1016/j.joule.2021.03.017.

Gorai, et al., Investigation of n-type doping strategies for Mg3Sb2, Journal of Materials Chemistry A, Jun. 23, 2018, pp. 13806-13815, vol. 6, Royal Society of Chemistry Publishing.

Zhang, et al., Rapid one-step synthesis and compaction of high-performance n-type Mg3Sb2 thermoelectrics, Angew Chem Int Ed Engl., Mar. 9, 2020, pp. 4278-4282, vol. 59, issue 11, German Chemical Society.

Yang, et al., Roles of concentration-dependent Cu doping behaviors on the thermoelectric properties of n-type Mg3Sb1.5Bi0.5, Journal of Materiomics, Jun. 9, 2023, pp. 154-162, vol. 10, issue 1, Chinese Ceramic Society.

European Patent Office, Application No. PCT/JP2021/031156, extended European search report.

* cited by examiner

THERMOELECTRIC MATERIAL, METHOD FOR PRODUCING SAME, AND THERMOELECTRIC POWER GENERATION ELEMENT

TECHNICAL FIELD

This invention relates to a thermoelectric material, a method for producing the same, and a thermoelectric power generation element, and this invention more specifically relates to a thermoelectric material containing a $Mg_3Bi_2$-system thermoelectric material, a method for producing the same, and a thermoelectric power generation element thereof.

BACKGROUND ART

It is a current situation that about three-fourths of the primary supply energy are disposed of as thermal energy in waste heat recovery in our country where energy conservation is particularly advanced in the world. Under such a circumstance, a thermoelectric power generation element is attracting attention as a solid-state element that can recover thermal energy and directly convert the thermal energy into electric energy.

Since the thermoelectric power generation element is a direct conversion element into electrical energy, it has an advantage in the easy maintenance such as ease of maintenance and scalability due to the absence of movable parts. Therefore, an active material research has been conducted with respect to thermoelectric semiconductors as an IoT operating power supply.

For IoT operation power supply applications, a thermoelectric material is expected to be used practically near room temperature and the thermoelectric material with the highest performance near room temperature is typically a $Bi_2Te_3$-based material, which has a disadvantage in a wide range of practical application due to the scarcity of Te. While only few materials having relatively high performance at room temperature other than the Te compounds were recognized, a $Mg_3Sb_2$-based material, however, has been proposed as a candidate (for example, Patent References 1 and 2 and Non-Patent Reference 1).

Non-Patent Reference 1 discloses a doped thermoelectric material in which Fe, Co, Hf, and Ta are doped on the magnesium (Mg) site of $Mg_{3.2}Sb_{1.5}Bi_{0.49}Te_{0.01}$ (for example, Patent Reference 1). Non-patent Reference 1 discloses that doping a small amount of the above-mentioned metal elements on the Mg site of $Mg_{3.2}Sb_{1.5}Bi_{0.5}Te_{0.01}$ as a $Mg_3Sb_2$-based material of the parent phase improves the performance index such that the electric conductivity and the Seebeck coefficient the thermoelectric material may become higher.

Patent Reference 1 relates to a thermoelectric material represented by $Mg_{3+m}A_aB_bD_{2-e}E_e$. Here, the element A represents at least one kind selected from the group consisting of Ca, Sr, Ba, and Yb; the element B represents at least one kind selected from the group consisting of Mn and Zn; the value of m is at least −0.39 and not exceeding 0.42; the value of a is at least 0 and not exceeding 0.12; the value of and b is at least 0 and not exceeding 0.48; the element D represents at least one kind selected from the group consisting of Sb and Bi; the element E represents at least one kind selected from the group consisting of Se and Te; and the value of e is at least 0.001 and not exceeding 0.06.

Patent Reference 2 relates to a thermoelectric material represented by $Mg_{3+m-a}A_aB_{2-c-e}C_cE_e$. Here, the element A represents at least one kind selected from the group consisting of Ca, Sr, Ba, Nb, Zn, and Al; the element B represents at least one kind selected from the group consisting of Sb and Bi; the element C represents at least one kind selected from the group consisting of Mn, Si, and Cr; the element E represents at least one kind selected from the group consisting of Se and Te; the value of m is at least −0.1 and not exceeding 0.4; the value of a is at least 0 and not exceeding 0.1; the value of c is at least 0 and not exceeding 0.1; and the value of e is at least 0.01 and not exceeding 0.06.

Although the patent references 1 and 2 and the non-patent reference 1 disclose various combinations of materials, values of the power factor and the dimensionless thermoelectric figure of merit ZT are not sufficient, in particular, at room temperature. To considering IoT power generation applications, it is expected that a thermoelectric material having a high power factor exceeding 14 $\mu Wcm^{-1}K^{-2}$ and a dimensionless thermoelectric figure of merit ZT exceeding 0.3 at room temperature will be developed.

PRIOR ART REFERENCE

Patent Reference

[Patent Reference 1] International Publication No. WO2017/072982.
[Patent Reference 2] Japanese Patent Application Publication No. 2018-190953.

Non-Patent Reference

[Non-Patent Reference 1] Jun Mao, et al., PNAS, 114(40), 10548-10553, 2017

SUMMARY OF THE INVENTION

Problem to be Solved By the Invention

From the above, in an embodiment of the present invention, it is an issue to provide a thermoelectric material with excellent thermoelectric properties at room temperature, a manufacturing method thereof, and a thermoelectric power generation element thereof.

Means To Solve The Problem

In an embodiment of the present invention, a thermoelectric material includes an inorganic compound including magnesium (Mg), antimony (Sb) and/or bismuth (Bi), copper (Cu), and, if necessary, M (wherein M is at least one kind of element selected from the group consisting of selenium (Se) and tellurium (Te)), wherein the inorganic compound may be represented by $Mg_aSb_{2-b-c}Bi_bM_cCu_d$ where the parameters a, b, c and d may satisfy:

$3 \le a \le 3.5$, $0 \le b \le 2$, $0 \le c \le 0.06$, $0 < d \le 0.1$, and $b+c \le 2$.

The above-mentioned issue is solved.
The parameter d may satisfy:

$0.005 \le d \le 0.05$.

The parameters a, b, c, and d may satisfy:

$3 \le a \le 3.5$, $0.2 \le b \le 0.7$, $0 \le c \le 0.06$, and $0.005 \le d \le 0.05$.

The inorganic compound may have a $La_2O_3$-type structure and the symmetry of the space group P-3m1.

The above-mentioned Cu may be solid-solved interstitially in the $La_2O_3$-type structure.

The thermoelectric material may be n-type.

The thermoelectric material may be in a form selected from the group consisting of a powder, a sintered body and a thin film.

The thermoelectric material may be in the form of a powder or a sintered body, and the inorganic compound may comprise crystal grains having an average grain diameter in the range of at least 3.5 μm and not exceeding 30 μm.

The inorganic compound may comprise crystal grains having an average grain diameter in the range of at least 4 μm and not exceeding 20 μm.

The thermoelectric material may be in the form of a thin film, and the inorganic compound may comprise crystal grains having an average grain diameter in the range of at least 3.5 μm and not exceeding 30 μm, and it may further include an organic material.

In an embodiment of the present invention, a method of manufacturing the above-mentioned thermoelectric material may include blending a raw material including magnesium (Mg), a raw material including antimony (Sb) and/or a raw material including bismuth (Bi), a raw material including copper (Cu), and, if necessary, a raw material including M (wherein M is at least one kind of element selected from the group consisting of selenium (Se) and Tellurium (Te)); preparing a mixture thereof; and sintering the mixture. The above-mentioned issue is solved.

The above-mentioned sintering may comprise spark plasma sintering.

The above-mentioned spark plasma sintering may comprise sintering in a temperature range of at least 723 K and not exceeding 1173 K, under a pressure of at least 30 MPa and not exceeding 100 MPa, for a period of time of at least 1 minute and not exceeding 10 minutes.

The method may further include pulverizing a sintered body obtained by the above-mentioned sintering.

The method may further include mixing a powder obtained by the above-mentioned pulverizing with an organic material.

The method may further include performing a physical vapor deposition method using the sintered body obtained by the above-mentioned sintering as a target.

In an embodiment of the present invention, the thermoelectric power generation element may comprise p-type and n-type thermoelectric materials connected in series alternately, and the n-type thermoelectric material may comprise the above-mentioned thermoelectric material. The above-mentioned issue is solved.

Effect of the Invention

In an embodiment of the present invention, a thermoelectric material includes an inorganic material including magnesium (Mg), antimony (Sb) and/or bismuth (Bi), copper (Cu), and, if necessary, M (where M is at least one kind of element selected from the group consisting of selenium (Se) and tellurium (Te)). The inorganic compound is represented by $Mg_aSb_{2-b-c}Bi_bM_cCu_d$ and satisfies $3 \le a \le 3.5$, $0 \le b \le 2$, $0 \le c \le 0.06$, $0 < d \le 0.1$, and $b+c \le 2$. Thus, a thermoelectric material, which has an improved thermoelectric figure of merit, can be provided as the electric conductivity is improved at room temperature and the thermal conductivity is effectively reduced by adding Cu to an inorganic compound comprising Mg, Sb and/or Bi, and M as a parent phase. Such a thermoelectric material is advantageous for a thermoelectric power generation element.

In an embodiment of the present invention, a method of manufacturing a thermoelectric material comprises blending a raw material including magnesium (Mg), a raw material including antimony (Sb) and/or a raw material including bismuth (Bi), a raw material including copper (Cu) and, if necessary, a raw material including M (where M is at least one kind of element selected from the group consisting of selenium (Se) and tellurium (Te)); preparing a mixture thereof; and sintering the mixture such that the above-mentioned thermoelectric material can be obtained such that the method has excellent versatility.

EMBODIMENT FOR CARRYING OUT THE INVENTION

Figure 1A:
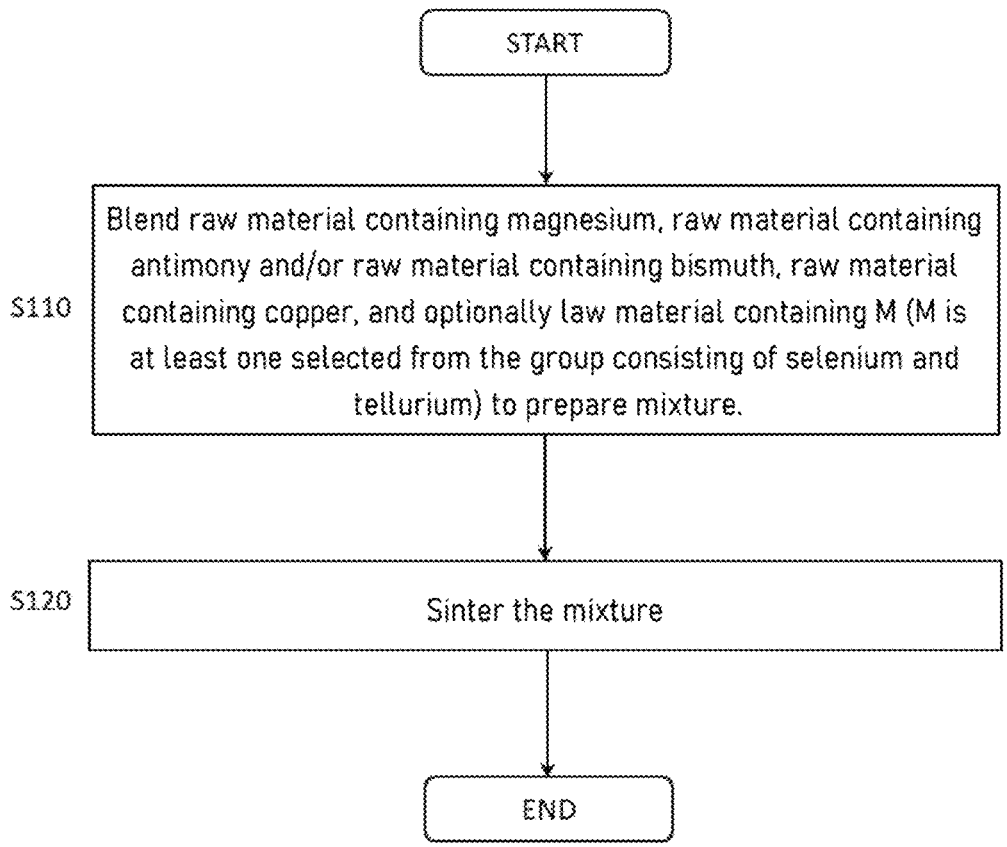
FIG. 1A shows a flowchart illustrating processes of manufacturing a thermoelectric material in an embodiment of the present invention.

In the following, an embodiment for carrying out the present invention will be explained with reference to the drawings. It should be noted that like numerals refer to like elements and explanations thereof will be omitted.

In an embodiment of the present invention, a thermoelectric material includes an inorganic compound including magnesium (Mg), antimony (Sb) and/or bismuth (Bi), copper (Cu), and, if necessary, M (where M is at least one kind of element selected from the group consisting of selenium (Se) and tellurium (Te)).

The inorganic compound is represented by $Mg_aSb_{2-b-c}Bi_bM_cCu_d$, and the parameters a to d satisfy:

$3 \leq a \leq 3.5$, $0 \leq b \leq 2$, $0 \leq c \leq 0.06$, $0 < d \leq 0.1$, and $b+c \leq 2$, respectively.

The inorganic compound may be configured as a whole like an inorganic compound having a composition, in which Cu is added to the inorganic compound comprising Mg, Sb and/or Bi, and M as a parent phase, by configuring such a composition. In this way, a thermoelectric material having an improved thermoelectric figure of merit can be provided as the electric conductivity is improved especially at room temperature (in the temperature range of at least 273 K and not exceeding 320 K) and the thermal conductivity is effectively reduced. In an embodiment of the present invention, the thermoelectric material can serve as an n-type thermoelectric material having electrons as carriers by satisfying the above-described composition.

The parent phase of the inorganic compound preferably may be comprised of $Mg_aSb_{2-b-c}Bi_bM_c$, to which Cu may be added. Here, the parent phase is preferably a $Mg_3Sb_2$-based crystal, which has a $La_2O_3$-type structure and belong to the space group P-3m1 (164th space group of the International Tables for Crystallography). Here, in the specification of the present application, it should be noted that "-3" represents 3 over bar (the letter 3 with an overbar).

The $Mg_3Sb_2$-based material may comprise the above-mentioned elements (e.g., Mg, Sb, Bi, Se, Te) and may have the above-mentioned crystal structure (e.g., $La_2O_3$-type structure) and the space group (e.g., P-3m1 space group). The $Mg_3Sb_2$-based material particularly does not have any other restrictions than the above and, by way of example, $Mg_3Sb_2$, $Mg_{3.2}(Sb, Bi)_2$, $Mg_{3.2}((Sb, Bi), M)_2$, and so on may be cited. When described as (Sb, Bi), it indicates that Sb and Bi may occupy the sites, which Sb or Bi is supposed to occupy, without being mutually distinguished, and when described as ((Sb, Bi), M), it indicates that Sb and/or Bi and M may occupy the sites, which Sb and/or Bi is supposed to occupy, without being mutually distinguished. Here, M is at least one kind of element selected from the group consisting of Se and Te. An exemplary composition of $Mg_{3.2}(Sb, Bi)_2$ includes $Mg_{3.2}Sb_{1.5}Bi_{0.5}$. An exemplary composition of $Mg_{3.2}((Sb, Bi), M)_2$ includes $Mg_{3.2}Sb_{1.5}Bi_{0.49}Te_{0.01}$. These materials may have the above-mentioned crystal structure and the above-mentioned space group, and it is considered that so-called excess components may also configure partially so-called defects in the crystal structure, and that the inorganic compound as a whole may be endowed with a feature such as n-type.

In an embodiment of the present invention, the $Mg_3Sb_2$-based crystal has a $La_2O_3$-type structure and belongs to the P-3m1 space group. FIG. 1B shows a schematic diagram illustrating the crystal structure of $Mg_3Sb_2$-based crystal. A constituent of the $Mg_3Sb_2$-based crystal can be replaced by another element and can be solid-solved as an interstitial atom (for example, Cu). In such a case, the lattice constants may change, but it is considered that the atom positions given by the crystal structure and the sites occupied by the atoms and their coordinates may not be changed significantly enough to break the chemical bonds between the skeleton atoms. In an embodiment of the present invention, if the lattice constants obtained by performing the Rietveld analysis of the X-ray or neutron diffraction results of the obtained inorganic compound with respect to the space group of P-3m1 match the theoretical values (a=4.582 Å, b=4.582 Å, c=7.2 44 Å) within ±5%, it can be determined to be the $Mg_3Sb_2$-based crystal.

In an embodiment of the present invention, the parent phase represented by $Mg_aSb_{2-b-c}Bi_bM_c$ may be the $Mg_3Sb_2$-based crystal, and Sb and Bi may be fully mutually substitutable. For example, the $Mg_3Sb_2$-based crystal may include a $Mg_3Bi_2$ crystal structure. For example, the parameter b may include 0 and may be greater than 0. It may be at least 0.2. It may also be not exceeding 2. It may also be not exceeding 0.7. Also, the c, which represents the amount of M (Se and/or Te) component, may include 0 or be greater than 0. It may be not exceeding 0.06. Adding M thereto may cause the obtained inorganic compound to have some feature without causing the crystal structure of $Mg_3Sb_2$-based crystal of the parent phase to be broken. The parameter d, which represents the amount of Cu component, is greater than 0. It may be more preferably at least 0.001 or at least 0.005. The parameter d may be not exceeding 0.1, and preferably not exceeding 0.05 or not exceeding 0.025. It may satisfy the range of $0<d\leq0.1$ or preferably satisfy the range of $0.005\leq d\leq0.05$. In such a range as described above, the electric conductivity at room temperature may further be improved and the thermal conductivity may further be reduced such that the thermoelectric figure of merit may be improved. The parameter d may more preferably satisfy the range of $0.005\leq d\leq0.025$. In this range, the thermoelectric figure of merit at room temperature can be improved.

The parameters a to d preferably satisfy:

$3\leq a\leq 3.5$, $0.2\leq b\leq 0.7$, $0\leq c\leq 0.06$, and $0.005\leq d\leq 0.05$.

In such a composition, the electric conductivity at room temperature may further be improved and the thermal conductivity may be reduced such that the thermoelectric figure of merit may be improved.

It can be considered that Cu atoms are preferably solid-solved interstitially in the $La_2O_3$-type structure. In general, it was considered that an element added to the $Mg_3Sb_2$-based crystal replaced partially some of the elements constituting the crystal structure. It was also considered that the crystal structure of the thus-obtained inorganic compound was affected. However, the present inventors have found that the addition of Cu can promote grain growth and grain boundary modification of the material. Such grain growth and grain boundary modification contribute to the scattering mechanism of carriers and, since the scattering decreases at relatively low temperature such as room temperature (not exceeding 500 K), the electric resistance at room temperature decreases and the electric conductivity increases such that the thermoelectric performance may be improved.

Here, it is considered that it can be found that Cu atoms are solid-solved interstitially by measuring changes of the lattice constants of the a-axis and the c-axis of the obtained inorganic compound by the powder X-ray diffraction analysis. If the $Mg_3Sb_2$-based crystal is identified from the obtained inorganic compound and the lattice constants (e.g., a and c) obtained from Rietveld analysis increase in comparison with those of the corresponding inorganic compound without any Cu addition, it may be judged that Cu atoms are solid-solved interstitially.

In an embodiment of the present invention, the thermoelectric material may be in a form selected from the group consisting of a powder, a sintered body, and a thin film. In this way, the material can be applied to various kinds of thermoelectric power generation elements that exhibit high thermoelectric performance at room temperature.

Here, in an embodiment of the present invention, if the thermoelectric material is in a form of powder or in a form of sintered body, the inorganic compound may comprise crystal grains having an average grain diameter in the range of at least 3.5 μm and not exceeding 30 μm. Thus, the scattering effect is increased and the electric conductivity at room temperature is improved such that the thermoelectric performance may be improved. More preferably, the inorganic compound may comprise crystal grains having an average grain size in the range of at least 4 μm and not exceeding 20 μm. In this way, the scattering effect is increased and the electric conductivity at room temperature is improved, and, in addition, the thermal conductivity is reduced while the grain diameter becomes larger such that the thermoelectric performance may be improved. Even more preferably, the inorganic compound may comprise crystal grains having an average grain size in the range of at least 4 μm and not exceeding 10 μm.

Here, in the specification of the present application, the average grain diameter of crystal grains was analyzed and calculated by the image analysis software (HKL CHANNEL 5, HKL Tango, ver. 5.12.72.0, Oxford Instruments, Inc.) attached to the electron beam backscatter diffraction (EBSD) measurement device.

In an embodiment of the present invention, the thermoelectric material may be in the form of a thin film, and the thin film may comprise a crystalline thin film by a physical vapor deposition method and so on as described later, or a thin film containing the above-mentioned powder. Here, in general, the powder may include what is crushed to become fine and a powder. The powder can be pressed by a press such as a powder compactor such that a compact may be formed. In general, the compact is what is formed into a predetermined shape by compressing the powder. When the compact is heated at a temperature below the melting point of the powder components, the mutual contact surfaces of the powder particles adhere to each other such that the compact shrinks and is densified with an increase of the heating time, the phenomenon of which may be called sintering, and the product obtained by the sintering may be called a sintered body. The thin film is referred to a film that is thin and may include a layer formed by condensation of a vapor phase on a solid surface.

In an embodiment of the present invention, when the thermoelectric material is a film containing powder of an inorganic compound, the powder is mixed with an organic material and processed and formed in a film. In this case, the organic material may comprise at least one kind selected from the group consisting of poly(3,4-ethylenedioxythiophene) polystyrene sulfonate (PEDOT: PSS), poly[2,5-bis (3-tetradecylthiophen-2-yl)thieno[3,2-b]thiophene] (PBTT), polyaniline (PANI), tetrathiafulvalene (TTF), and benzodifurandione paraphenylenevinylidene (BDPPV) and the organic material may be used. A flexible film thermoelectric material may be provided by using these organic materials.

In this case, as long as the film can be formed, there is no restriction about the amount of contained powder, but preferably the powder may be contained in the range of at least 4 mass % and not exceeding 80 mass %, preferably in the range of at least 4 mass % and not exceeding 50 mass %, further preferably in the range of at least 4 mass % and not exceeding 10 mass %, yet more preferably in the range of at least 4 mass % and not exceeding 7 mass %, with respect to the organic material. In this way, it may be a film that is flexible and has a good thermoelectric performance.

In an embodiment of the present invention, the thermoelectric material may have improved electrical conductivity especially at room temperature and have effectively reduced thermal conductivity such that the thermoelectric figure of merit may be improved. Even though Cu was added, the thermoelectric material did not lose a superior thermoelectric figure of merit that the $Mg_3Sb_2$-based material inherently possesses at high temperatures (for example, 573 K and so on).

Next, in such an embodiment of the present invention, an exemplary manufacturing method of the thermoelectric material is described.

Figure 1B:
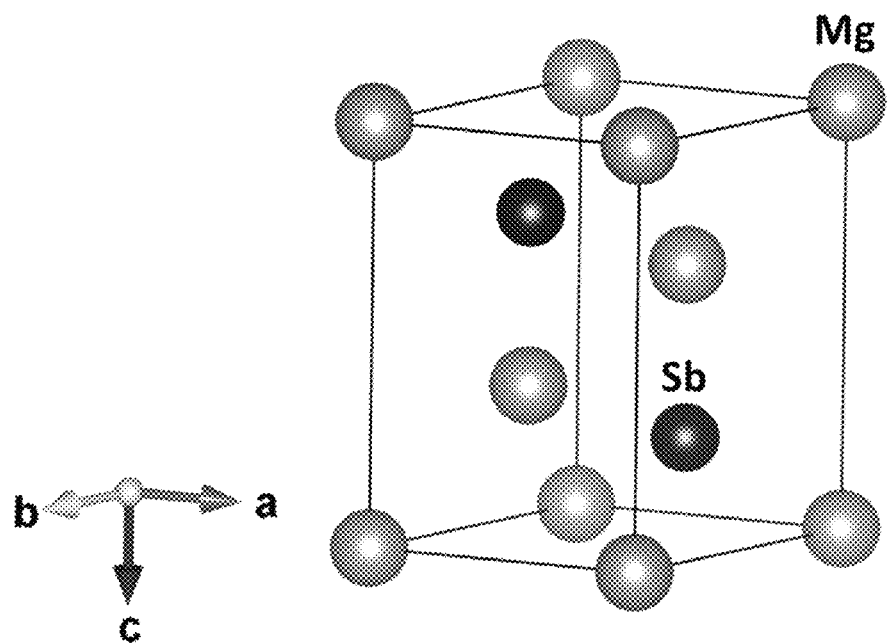
FIG. 1B shows a schematic diagram of $Mg_3(Sb, Bi)_2$-based crystal having a $La_2O_3$-type structure.

FIG. 1A shows a flowchart illustrating processes of manufacturing the thermoelectric material in an embodiment of the present invention.

Step S110: Blending a raw material containing magnesium (Mg), a raw material containing antimony (Sb) and/or a raw material containing bismuth (Bi), a raw material containing copper (Cu), and, if necessary, a raw material containing M (where M is at least one kind of element selected from the group consisting of selenium (Se) and tellurium (Te)) and preparing a mixture thereof.

Step S120: Firing the mixture obtained in step S110.

In an embodiment of the present invention, the thermoelectric material is obtained by the above-mentioned steps S110 and S120. Each step is described in detail.

In step S110, the raw material containing Mg may be Mg single metal or Mg silicide, oxide, carbonate, nitride, oxynitride, chloride, fluoride, or acid fluoride. The raw material containing Sb may be Sb single metal or Sb silicide, oxide, carbonate, nitride, oxynitride, chloride, fluoride, or acid fluoride. The raw material containing Bi may be Bi single metal or Bi silicide, oxide, carbonate, nitride, oxynitride, chloride, fluoride, or acid fluoride. The raw material containing Cu may be Cu single metal or Cu silicide, oxide, carbonate, nitride, oxynitride, chloride, fluoride, or acid fluoride. The raw material containing M may be M single metal or M silicide, oxide, carbonate, nitride, oxynitride, chloride, fluoride, or acid fluoride. It is preferable that the raw materials are in the form of powder, grain, or small lump in view of mixability and easy handling.

In step S110, the metal elements in the raw materials are mixed such that the following composition formula $Mg_aSb_{2-b-c}Bi_bM_cCu_d$ may be satisfied. Here, the parameters a, b, c and d satisfy:

$3 \leq a \leq 3.5$, $0 \leq b \leq 2$, $0 \leq c \leq 0.06$, $0 < d \leq 0.1$, and $b+c \leq 2$.

Here, the preferred parameters are as described above and the explanation thereof is omitted.

In step S120, the sintering may be performed by any method such as spark plasma sintering (SPS), hot press sintering (HP), hot isostatic pressure sintering (HIP), cold isostatic pressure sintering (CIP), pulse electric current sintering, and preferably performed by spark plasma sintering (SPS). In this way, a sintered body with suppressed grain growth for a short time may be obtained without using any sintering aids.

The SPS may preferably be performed in the temperature range of at least 723 K and not exceeding 1173 K, under a pressure of at least 30 MPa and not exceeding 100 MPa, for a period of time of at least 1 minute and not exceeding 10 minutes. In an embodiment of the present invention, under this condition, the thermoelectric material of the above-mentioned sintered body is obtained with a good yield ratio.

Furthermore, the thus-obtained sintered body may be milled by the mechanical milling such as a ball mill. In an embodiment of the present invention, in this way, a thermoelectric material in the form of powder is obtained.

In an embodiment of the present invention, the thus-obtained thermoelectric material in the form of powder may be mixed with an organic material such that a flexible thermoelectric material may be provided. In this case, the organic material and mixing ratio as described above can be employed.

Alternatively, the thus-obtained sintered material may be used as a target such that a physical vapor deposition method may also be performed. In an embodiment of the present invention, a thin film made of the thermoelectric material can be provided.

Embodiment 2

In Embodiment 2, the thermoelectric power generation element using the thermoelectric material as described in Embodiment 1 is explained in an embodiment of the present invention.

Figure 2A:
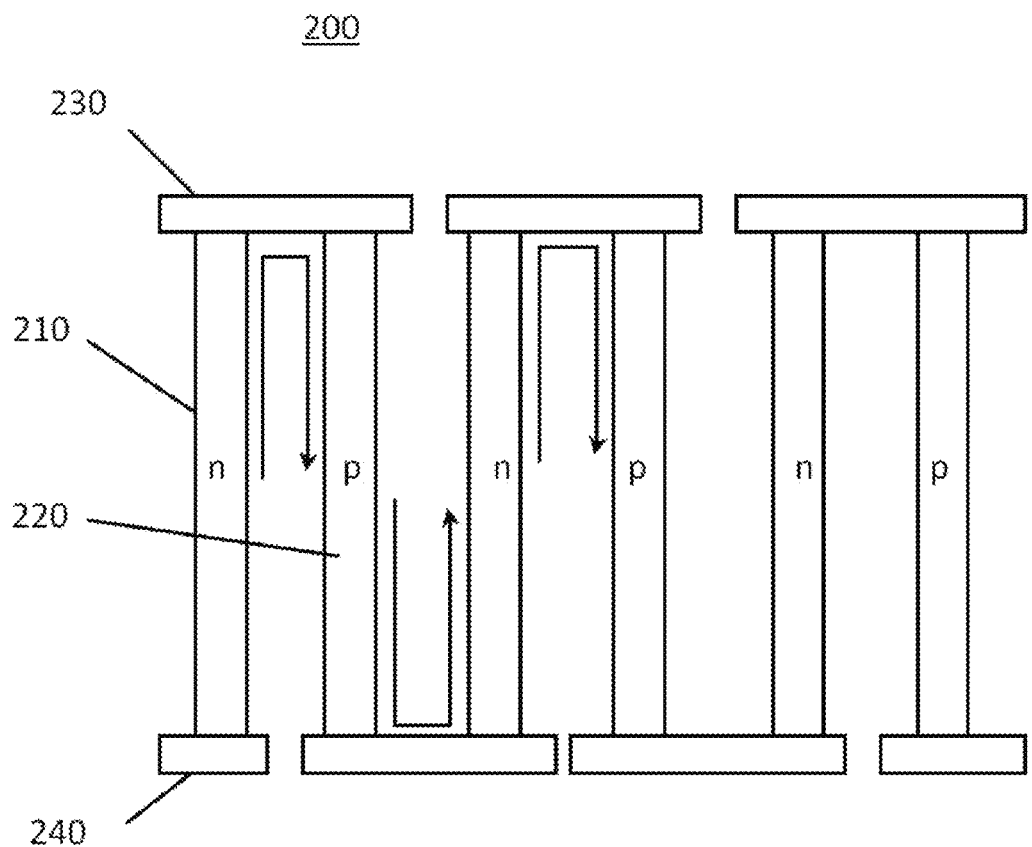
FIG. 2A shows a Schematic diagram illustrating a thermoelectric power generation element (π-shaped (pai-shaped)) using a thermoelectric material in an embodiment of the present invention.

FIG. 2A shows a schematic diagram illustrating a thermoelectric power generating element (π-shaped (pai-shaped)) using a thermoelectric material in an embodiment of the present invention.

In an embodiment of the present invention, the thermoelectric power generation element 200 includes a pair of n-type thermoelectric materials 210 and p-type thermoelectric materials 220, and electrodes 230 and 240 at their respective end parts. The electrodes 230 and 240 electrically connect the n-type thermoelectric materials 210 and p-type thermoelectric materials 220 in series.

Here, the p-type thermoelectric material 210 is not particularly restricted and preferably has a high thermoelectric performance (for example, ZT is from 0.4 to 1.6) at a temperature of not exceeding 500 K, especially at room temperature. By way of example, the p-type thermoelectric material 210 may be a BiSbTe-based material, a MgAgSb-based material, an AgSbSe-based material, etc. As an exemplary composition of the BiSbTe-based material, for example, $Bi_{0.5}Sb_{1.5}Te_3$ and $Bi_{0.4}Sb_{1.6}Te_3$ are cited. As an exemplary composition of the MgAgSb-based material, for example, MgAgSb and $MgAg_{0.965}Ni_{0.005}Sb_{0.99}$ are cited. As an exemplary composition of the AgSbSe-based material, for example, $AgSbSe_2$ is cited. It should be noted that these are just examples, but not limiting.

On the other hand, in an embodiment of the present invention, the n-type thermoelectric materials 220 are the thermoelectric materials as described in Embodiment 1. In an embodiment of the present invention, the thermoelectric material exhibits excellent thermoelectric characteristics, especially at room temperature, which is advantageous for waste heat recovery.

The electrodes 230 and 240 can comprise an ordinary electrode material and, by way of example, Fe, Ag, Al, Ni, Cu, and so on can be cited.

FIG. 2A shows a state that a chip made of the n-type thermoelectric material 210 is joined to the electrode 240 on the side of the lower temperature with solder or the like, and the opposite end part of the chip of the n-type thermoelectric material 210 and the electrode 230 on the side of the higher temperature are joined with solder or the like. Similarly, it shows a state that a chip made of the p-type thermoelectric material 220 is joined to the electrode 230 on the side of the higher temperature with solder or the like, and the opposite end part of the chip of the p-type thermoelectric material 220 and the electrode 240 on the side of the lower temperature are joined with solder or the like.

In an embodiment of the present invention, when the thermoelectric power generation element 200 is installed in an environment where the electrode 230 is on the hotter side and the electrode 240 is on the colder side if compared to the electrode 230, and the electrodes on the end parts are connected to an electric circuit or the like, an electric voltage is generated by the Seebeck effect and an electric current flows in the order of the electrode 240, the n-type thermoelectric material 210, the electrode 230 and the p-type thermoelectric material 220, as shown by the arrow in FIG. 2A. In detail, the current flows according to the principle that electrons in the n-type thermoelectric materials 210 obtain thermal energy from the high temperature electrode 230 and move to the low temperature electrode 240, where the electrons release the thermal energy, whereas positive holes in the p-type thermoelectric materials 220 obtain thermal energy from the high temperature electrode 230 and move to the low temperature electrode 240, where the positive holes release thermal energy.

Since the thermoelectric materials as described in Embodiment 1 are used as the n-type thermoelectric materials 210 in an embodiment of the present invention, a thermoelectric power generation element 200 with a large amount of power generation can be realized especially at room temperature (at least 275 K and not exceeding 320 K). Further, if the thermoelectric material in an embodiment of the present invention utilizes a powder made of an inorganic compound having a parent phase of the $Mg_3Sb_2$-based material to which Cu atoms are added or a film containing the powder; or if the thermoelectric material in an embodiment of the present invention utilizes a thin film obtained by making a sintered body made of the above-mentioned inorganic compound as a target, a flexible thermoelectric power generation module can be provided as an IoT power source. For example, FIG. 2C illustrates how particles 330 made of a sputtered inorganic compound are deposited on a substrate 310 and a thin film 340 is formed thereon by sputtering the sintered body as the target 300 made of the inorganic compound with argon 320. It goes without saying that the thin film 340 can be peeled off from the substrate 310 using existing technologies and formed into a film without the substrate. For example, FIG. 2D illustrates a powder 350 made of this inorganic compound. If the powder 350 is compacted by the powder compactor 370, a compacted body 360 is obtained, and if the compacted body 380 is placed in the sintering furnace 390 and sintered, a sintered body 400 is obtained.

In an embodiment of the present invention, if the thermoelectric material is used, a thermoelectric power generation element 200 with a large amount of power generation at room temperature can be provided, but, in an embodiment of the present invention, the use of the thermoelectric power generation element 200 is not limited in the temperature range higher than the room temperature (for example, 573 K and so on). It goes without saying that a thermoelectric power generation element with a large power generation amount can be provided since the high dimensionless thermoelectric figure of merit (ZT) is indicated.

Figure 2B:
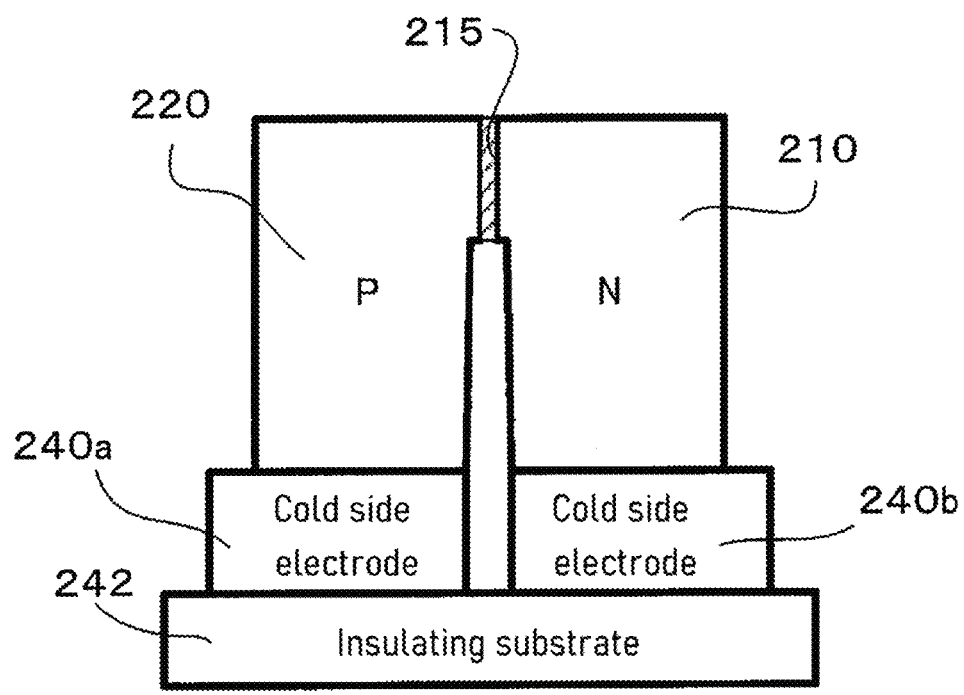
FIG. 2B shows a schematic diagram illustrating a thermoelectric power generation element (U-shaped) using a thermoelectric material in an embodiment of the present invention.
Figure 2C:
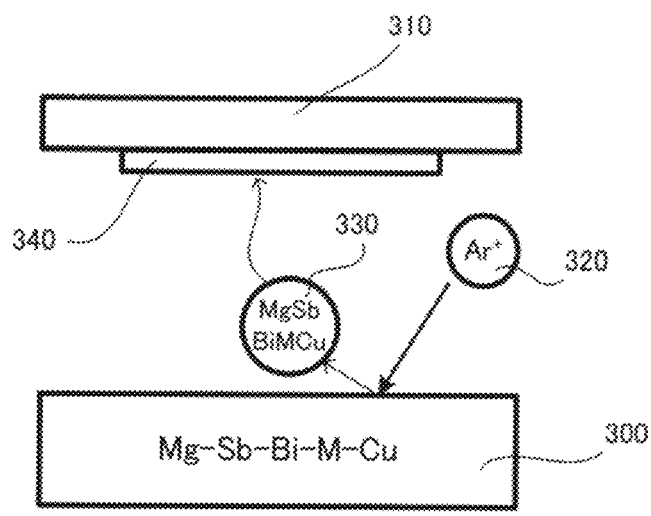
FIG. 2C shows a schematic diagram illustrating thin film production using a thermoelectric material in an embodiment of the present invention.
Figure 2D:
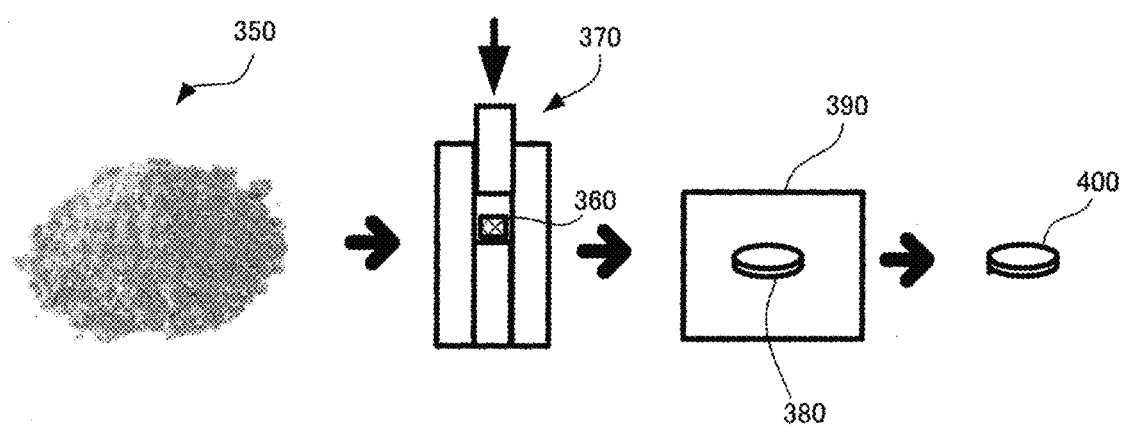
FIG. 2D shows a schematic diagram illustrating a powder, a powder compactor, a sintering furnace, and a sintered body using a thermoelectric material in an embodiment of the present invention.

In FIG. 2A, the explanation is made utilizing the n-shaped thermoelectric generation element, but in an embodiment of the present invention, the thermoelectric material may be used in a U-shaped thermoelectric generation element (FIG. 2B). In this case, a n-type thermoelectric material 210 and a p-type thermoelectric material 220, both of which comprise thermoelectric materials, are directly connected on a higher temperature side at a junction 215. It may be configured by making electrodes 240a and 240b on the lower temperature side be electrically connected to respective electrodes on the lower temperature side of separate U-shaped thermoelectric elements, respectively.

In the following, details about the present invention are explained using concrete embodiments and it should be understood that the invention is not limited to these embodiments.

Embodiments

[Raw Materials]

In the following examples, Mg (powder, 99.99% purity, Sigma-Aldrich Japan G.K.), Sb (powder, 99.99% purity, Sigma-Aldrich Japan G.K.), Bi (powder, 99.99% purity, Sigma-Aldrich Japan G.K.), Te (powder, 99.99% purity, Sigma-Aldrich Japan G.K.), and, if necessary, Cu (powder, 99.99% purity, Sigma-Aldrich Japan G.K.) were used. Sigma-Aldrich Japan G.K.), and Cu (powder, 99.99% purity, Sigma-Aldrich Japan G.K.) were used.

Examples 1 to 10

In Examples 1 to 5, the raw materials were blended so as to satisfy the general formula: $Mg_{3.2}Sb_{1.5}Bi_{0.49}Te_{0.01}Cu_d$ (d=0, 0.005, 0.01, 0.025, or 0.05) to produce a thermoelectric material. In Examples 6 to 7, the raw materials were blended so as to satisfy the general formula: $Mg_{3.2}Sb_{0.5}Bi_{1.498}Te_{0.002}Cu_{0.01}$, and in Examples 8 to 10, the raw materials were blended to satisfy the general formula: $Mg_{3.2}Sb_{0.5}Bi_{1.495}Te_{0.005}Cu_{0.01}$ such that respective thermoelectric materials were prepared.

Each raw material powder was weighed so as to meet each composition in Table 1, each mixture of raw materials was filled into a stainless steel ball mill container in a glove box, and each mixture was blended (or mixed) in a ball mill for 5 hours. Then, the mixture was sintered at 973 K for 5 minutes in a spark plasma sintering device (SPS, SPS Syntex, Inc., SPS-1080 system). In detail, a graphite sintering die (inner diameter 10 mm, height 30 mm) was filled with the mixture and held under uniaxial stress of 60 MPa at a sintering temperature of 973 K for 5 minutes with a temperature increase rate of 100 K/min. Thus, a sintered body thereof was obtained. The samples of Examples 1 to 5 met the compositions of d=0.005, d=0.01, d=0.025, d=0.05, and d=0, respectively, while the samples of Examples 6 to 10 met the compositions as described above.

The sintered bodies were observed. Surface observation was also performed using a scanning electron microscope (SEM, JEOL Ltd., JSM-7800F) equipped with an electron beam backscatter diffraction detector EBSD) and an energy dispersive X-ray spectrometer (EDS) such that an average grain diameter (or arithmetic mean grain diameter) of each sintered body was measured. The average grain diameter was calculated using the above-mentioned image analysis software. These results are shown in FIGS. 3 to 6 and Table 2.

Figure 7:
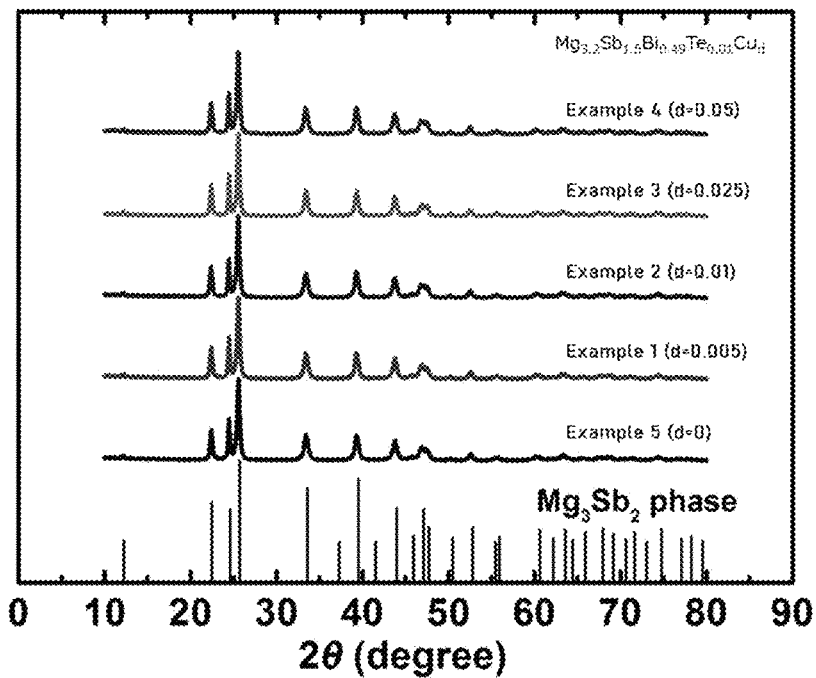
FIG. 7 shows a diagram illustrating XRD patterns of the samples of Examples 1 to 5.
Figure 8:
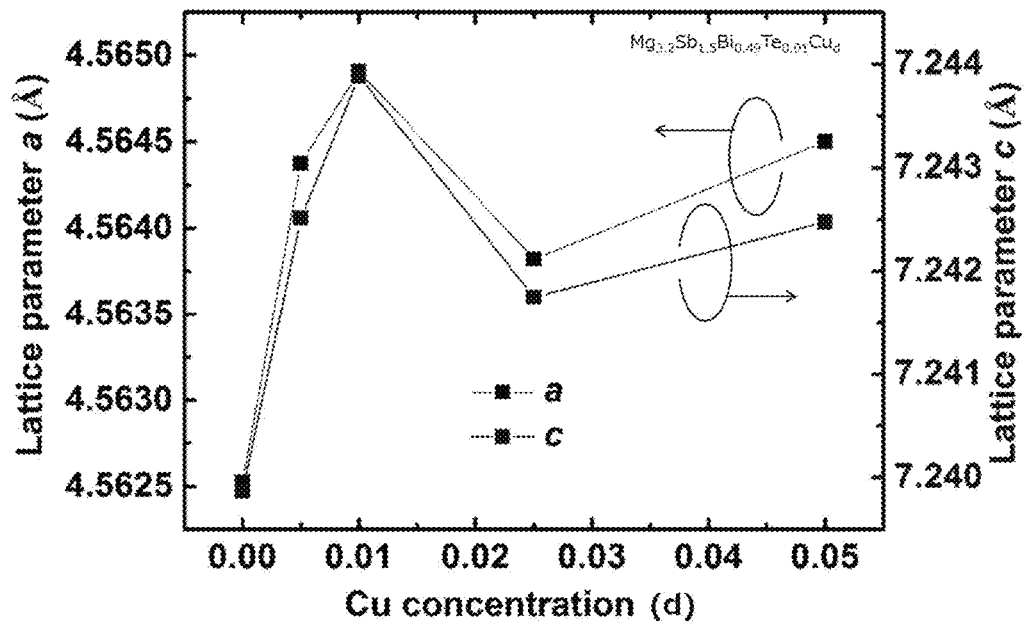
FIG. 8 shows a diagram showing dependence of lattice constants of samples of Examples 1 to 5 on an amount of added Cu.

The thus-obtained fired body was wet-milled with ethanol in an agate mortar. After milling, the particles of the fired body were sieved through a mesh (45 μm in aperture), and only particles with a diameter of 45 μm or less that passed through the mesh were taken out. The particles were identified by the powder X-ray diffraction (Rigaku Corporation, SmartLab 3) and analyzed for composition by the X-ray fluorescence analysis (HORIBA, Ltd., EMAX Evolution EX). The results of the X-ray diffraction are shown in FIGS. 7 and 8.

The sintered body was machined into the 1.5 mm×1.5 mm×9 mm rectangular parallelepiped by a high-speed cutter, and electric conductivity and thermoelectric properties were measured. The electric conductivity was measured by the DC four-terminal method. The Seebeck coefficient and thermal conductivity as thermoelectric properties were measured by the steady-state temperature difference method using the thermoelectric property measurement evaluation device (ADVANCE RIKO, Inc., ZEM-3) and the thermal conductivity evaluation device (Netzsch, HyperflashXXX), respectively. Both measurements were performed under a helium gas atmosphere and in a temperature range from room temperature to 800 K. The electrical output factor (power factor) was calculated from the thermoelectromotive force obtained from the electric conductivity or electric resistivity and the Seebeck coefficient, and the dimensionless thermoelectric figure of merit ZT was calculated from the Seebeck coefficient, the electric conductivity, and the thermal conductivity. These results are shown in FIGS. 9 to 15 and Table 3 and discussed later.

For simplicity, Table 1 summarizes the manufacturing conditions for the samples of Examples 1 to 10. All of the samples of Examples 1 to 10 were sintered at the stress of 60 MPa. Examples 1 to 5 were sintered at the sintering temperature of 973 K (700° C.) for 5 minutes. Examples 6 and 8 were sintered at the sintering temperature of 973 K (700° C.) for 10 minutes, Examples 7 and 9 were sintered at the sintering temperature of 1023 K (750° C.) for 10 minutes, and Example 10 was sintered at the sintering temperature of 1073 K (800° C.) for 10 minutes. These results are explained in the following.

TABLE 1

Lists of design compositions (parameters) and sintering conditions of samples of Examples 1-10

| Example | Mg a | Sb 2-b-c | Bi b | Te c | Cu d | Stress (Mpa) | Temperature (K) | Time (minutes) |
|---|---|---|---|---|---|---|---|---|
| 1 | 3.2 | 1.5 | 0.49 | 0.01 | 0.005 | 60 | 973 | 5 |
| 2 | 3.2 | 1.5 | 0.49 | 0.01 | 0.01 | 60 | 973 | 5 |
| 3 | 3.2 | 1.5 | 0.49 | 0.01 | 0.025 | 60 | 973 | 5 |
| 4 | 3.2 | 1.5 | 0.49 | 0.01 | 0.05 | 60 | 973 | 5 |
| 5 | 3.2 | 1.5 | 0.49 | 0 | 0 | 60 | 973 | 5 |
| 6 | 3.2 | 0.5 | 1.498 | 0.002 | 0.01 | 60 | 973 | 10 |
| 7 | 3.2 | 0.5 | 1.498 | 0.002 | 0.01 | 60 | 1023 | 10 |
| 8 | 3.2 | 0.5 | 1.495 | 0.005 | 0.01 | 60 | 973 | 10 |
| 9 | 3.2 | 0.5 | 1.495 | 0.005 | 0.01 | 60 | 1023 | 10 |
| 10 | 3.2 | 0.5 | 1.495 | 0.005 | 0.01 | 60 | 1073 | 10 |

Figure 3:
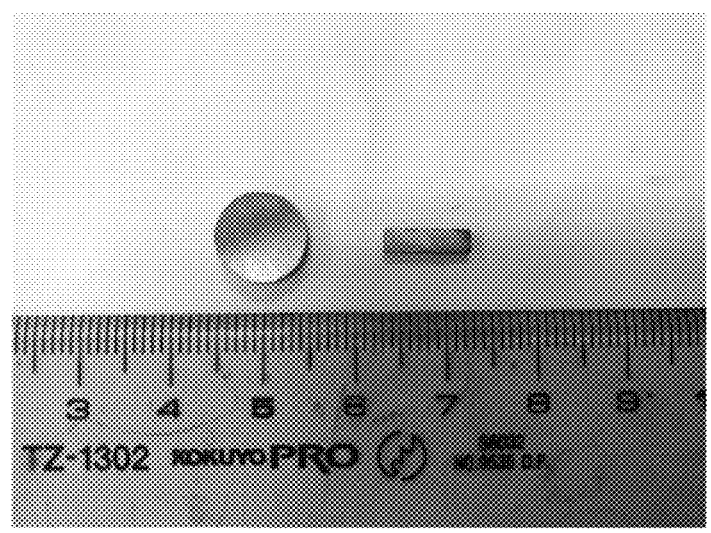
FIG. 3 shows a diagram showing an outer appearance of a sample of Example 1.

FIG. 3 shows a diagram showing the appearance of the sample of Example 1.

As shown in FIG. 3, the sample of Example 1 was a disk-like sintered body of 10 mm diameter and 2 mm thick. The other samples, not shown in the figure, had similar morphology.

Figure 4:
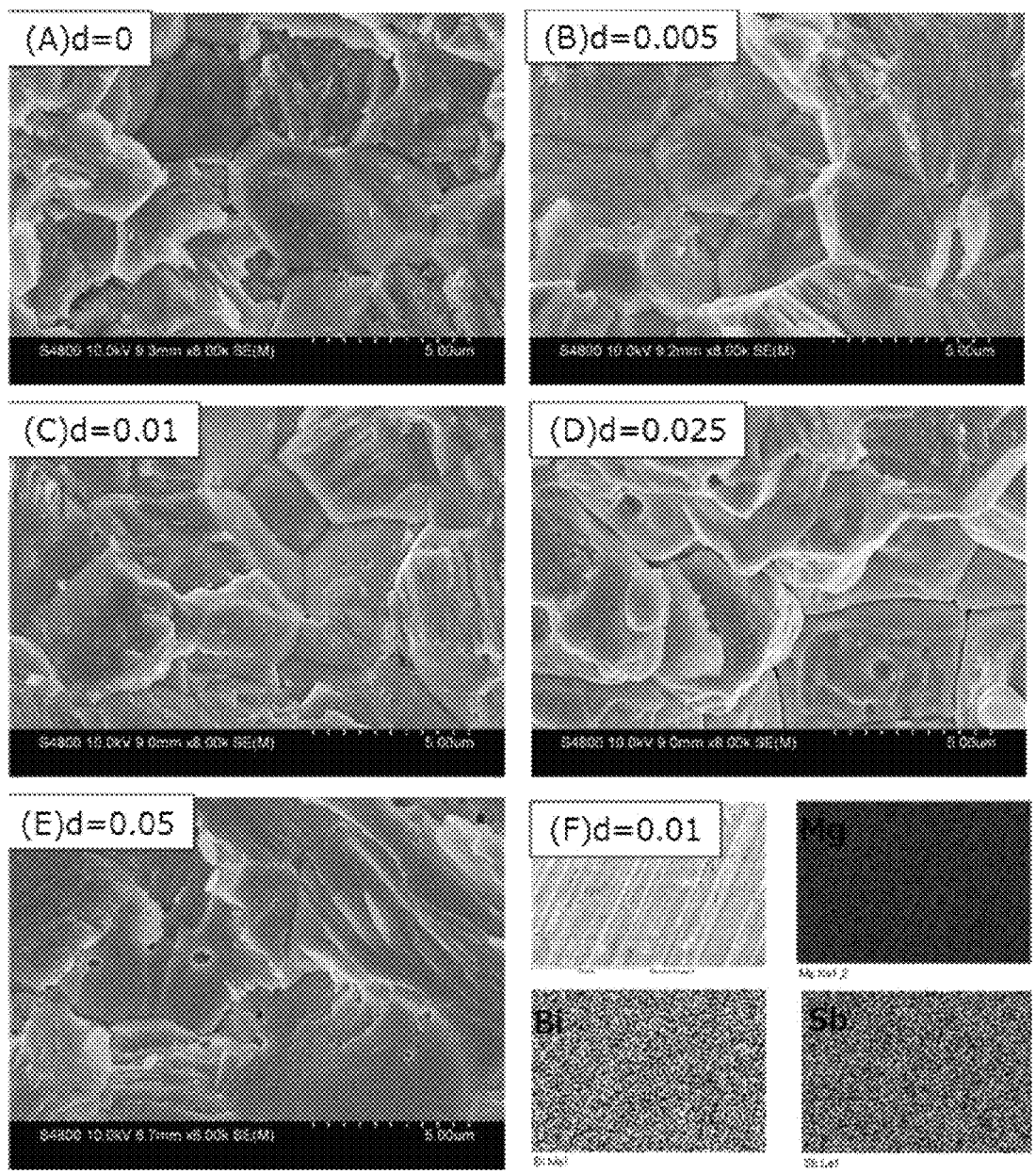
FIG. 4 shows a diagram showing SEM images and EDS mappings of samples of Examples 1 to 5.

FIG. 4 shows SEM images and EDS mappings of the samples of Examples 1 to 5.

In FIG. 4, (A)-(E) indicate SEM images of respective samples of Examples 5 and 1 to 4, respectively, and (F) indicates EDS mappings of the sample of Example 2.

According to FIG. 4 with symbols of (A)-(E), it is shown that the addition of Cu caused grain growth clearly and the grain diameters were increased with an increase of the amount of added Cu. FIG. 4 with indication (F) shows images in grayscale and it was confirmed that Mg, Bi, and Sb were uniformly located throughout.

Figure 5:
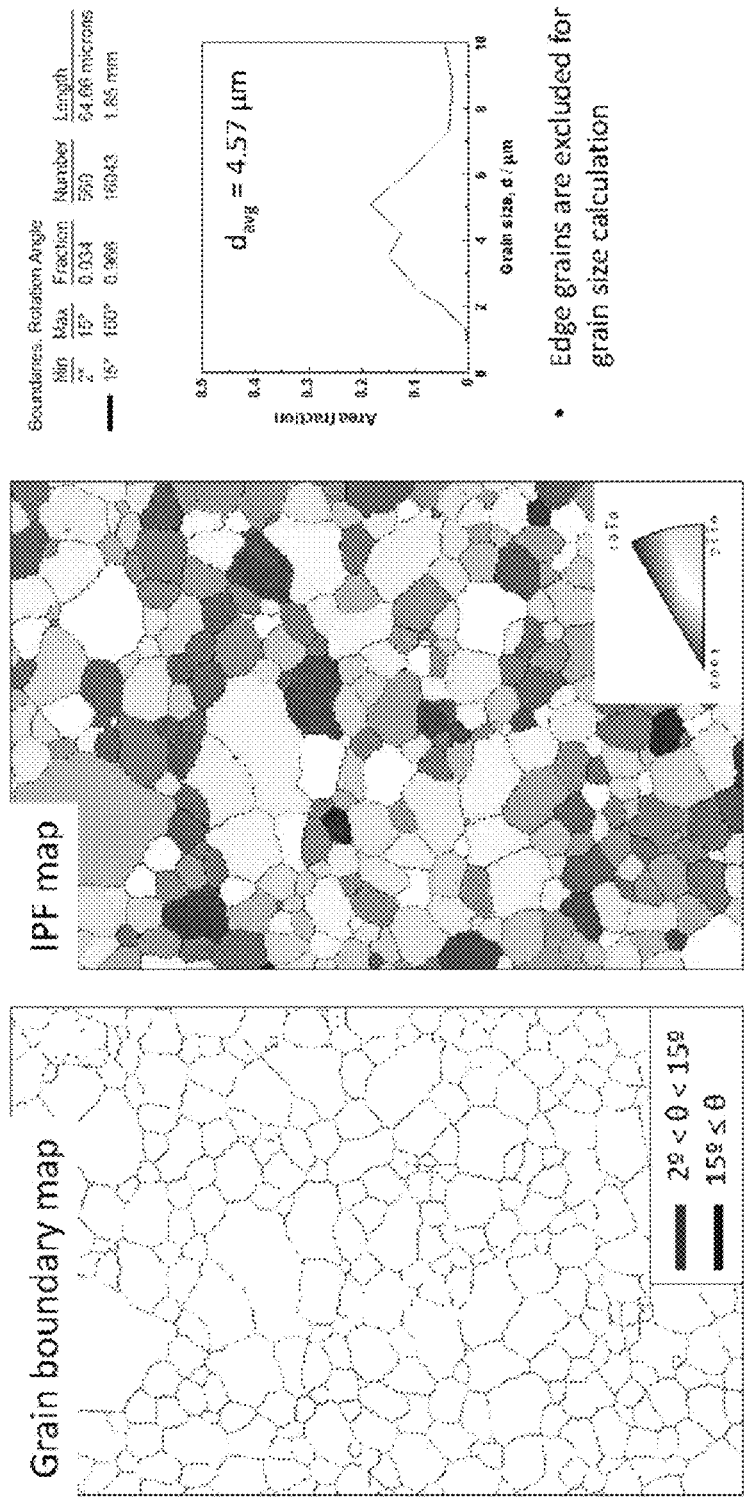
FIG. 5 shows a diagram illustrating an EBSD image of a sample of Example 2.

FIG. 5 shows a diagram illustrating EBSD images of the sample of Example 2.

Figure 6:
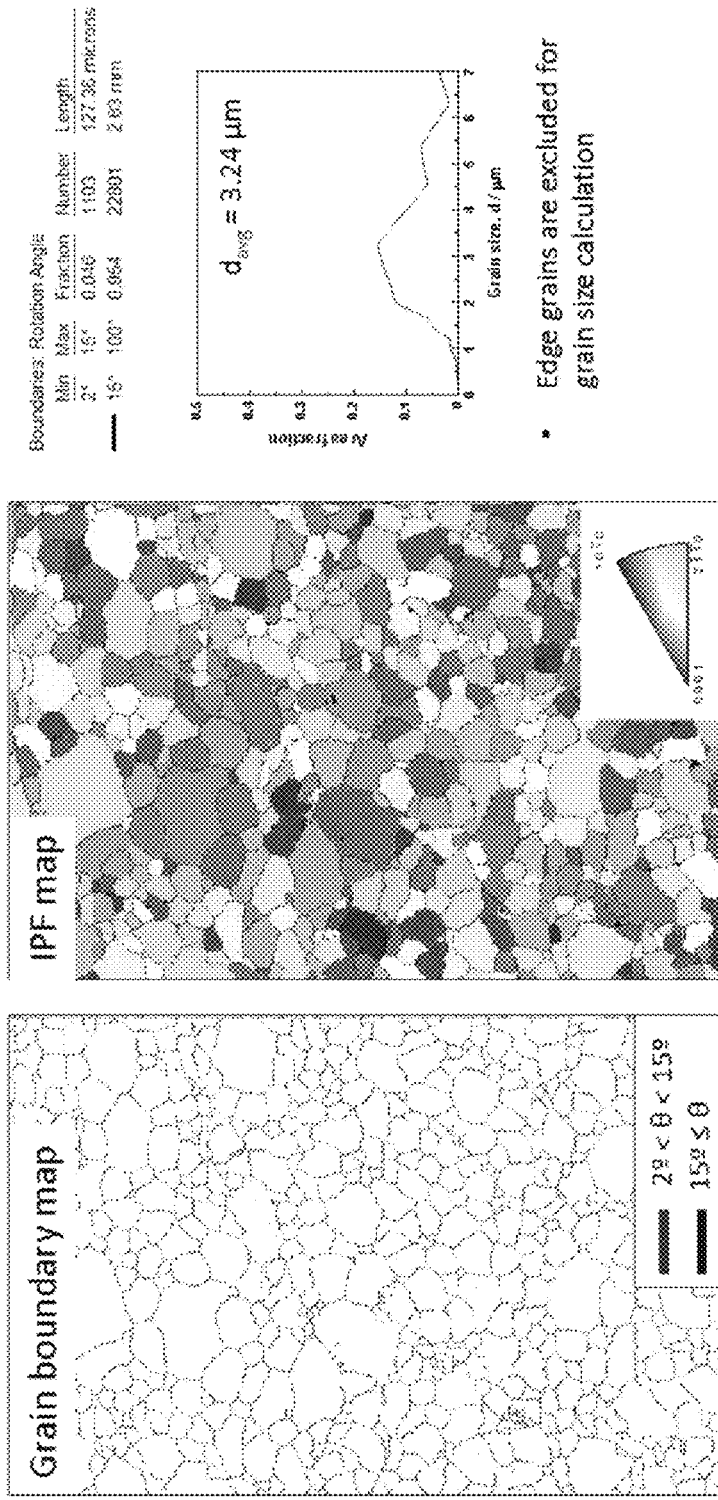
FIG. 6 shows a diagram illustrating an EBSD image of a sample of Example 5.

FIG. 6 shows a diagram illustrating EBSD images of the sample of Example 5.

In FIGS. 5 and 6, crystal grain mappings and histograms of grain sizes (diameters) are shown along with the inverse pole figure (IPF) map. According to FIGS. 5 and 6, the average grain diameter of the sample of Example 5 without any added Cu was 3.24 μm, while that of the sample of Example 2 with added Cu was 4.57 μm. According to the EBSD images and SEM images, it is suggested that the samples of Examples 1, 3, 4 with added Cu might comprise an inorganic compound with an average particle diameter of at least 4 μm and not exceeding 6 μm. It was also found that the average grain diameter might be increased by more than 40% with the addition of Cu. Further, it was shown that the average grain diameter tended to increase with an increase of the amount of added Cu.

FIG. 7 shows a diagram showing the XRD patterns of the samples of Examples 1 to 5.

FIG. 8 shows a diagram showing the dependence of the lattice constants of the samples of Examples 1 to 5 on the amount of added Cu.

According to FIG. 7, all the diffraction peaks of the XRD patterns of the samples of Examples 1 to 5 match those of the $Mg_2Sb_3$ phase such that it was found that the samples of Examples 1 to 5 are inorganic compounds having $La_2O_3$-type structure and P-3m1 space group symmetry. According to the compositional analysis, it was confirmed that the compositions of all samples were consistent with the design compositions. According to FIG. 8, both the a-axis and c-axis were increased by the addition of Cu. In general, the atomic diameter of Cu is not so large as compared to that of Mg or Sb. Therefore, it was shown that Cu was solid-solved interstitially (interstitial solid solution), but not solid-solved substitutionally (substitutional solid solution).

Thus, it was shown that the samples of Examples 1 to 4 included an inorganic compound in which Cu was added to an inorganic crystal having the $La_2O_3$-type structure and including Mg, Sb, Bi, and Te, which served as a host crystal.

TABLE 2

Lists of crystal structure and average particle diameters of samples of Examples 1-5

| Example | Mg a | Sb 2-b-c | Bi b | Te U | Cu d | Crystal structure | Average grain size (μm) |
|---|---|---|---|---|---|---|---|
| 1 | 3.2 | 1.5 | 0.49 | 0.01 | 0.005 | $La_2O_3$ type structure | — |
| 2 | 3.2 | 1.5 | 0.49 | 0.01 | 0.01 | $La_2O_3$ type structure | 4.57 |
| 3 | 3.2 | 1.5 | 0.49 | 0.01 | 0.025 | $La_2O_3$ type structure | — |
| 4 | 3.2 | 1.5 | 0.49 | 0.01 | 0.05 | $La_2O_3$ type structure | — |
| 5 | 3.2 | 1.5 | 0.49 | 0.01 | 0 | $La_2O_3$ type structure | 3.24 |

*"—" indicates not measured.

Figure 9:
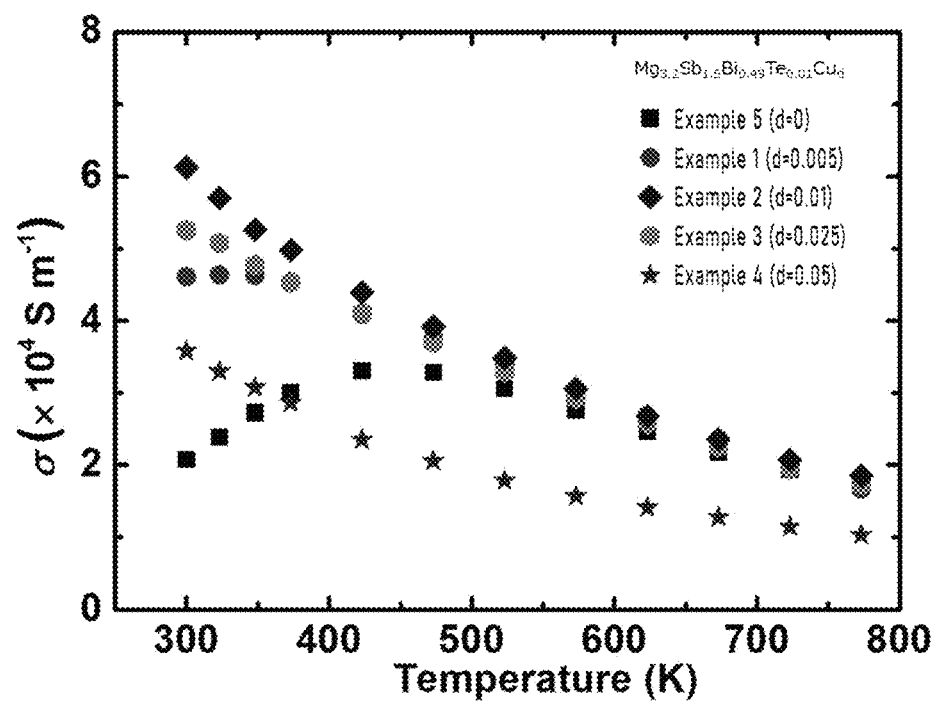
FIG. 9 shows a diagram showing a temperature dependence of electric conductivity of samples of Examples 1 to 5.
Figure 16:
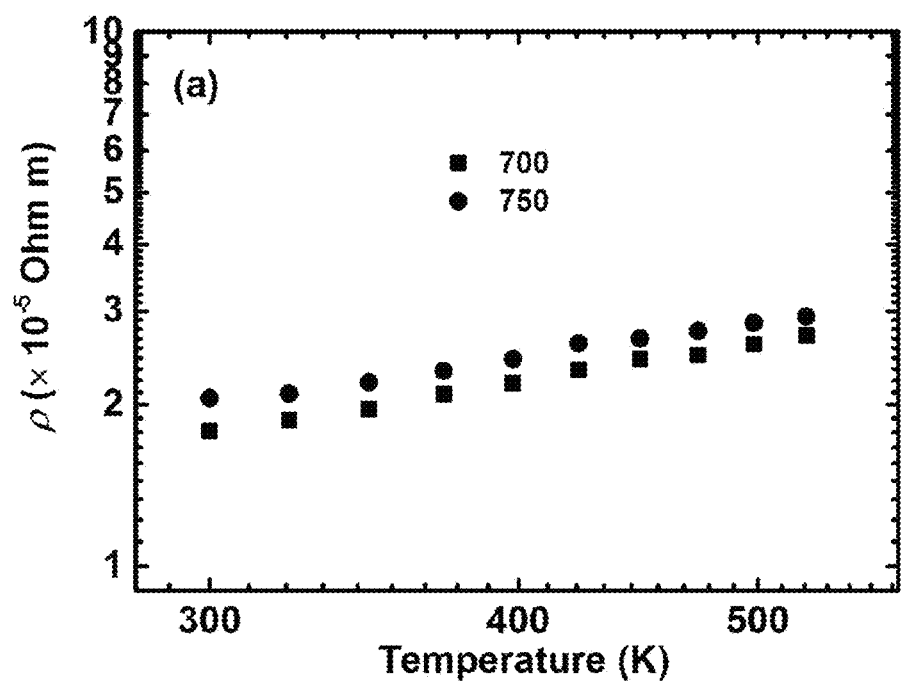
FIG. 16 shows a diagram showing a temperature dependence of electric conductivity of samples of Examples 6 to 7.
Figure 22:
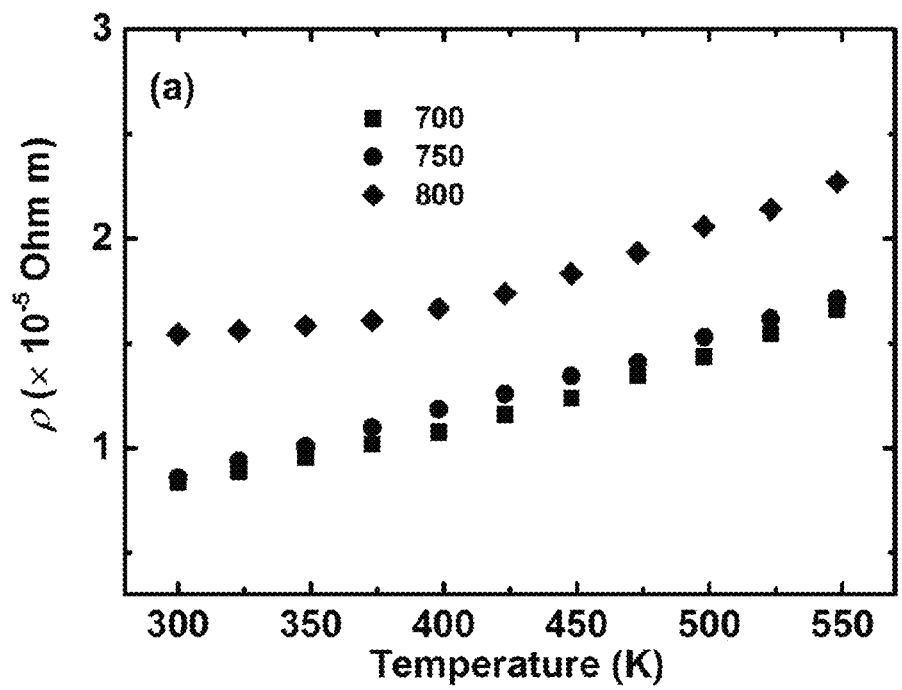
FIG. 22 shows a diagram showing a temperature dependence of electric conductivity of samples of Examples 8 to 10.

FIG. 9 shows a diagram showing the temperature dependence of the electric conductivity of the samples of Examples 1 to 5. FIG. 16 shows a diagram showing the temperature dependence of the electric conductivity of the samples of Examples 6 to 7, and FIG. 22 shows a diagram showing the temperature dependence of the electric conductivity of the samples of Examples 8 to 10.

According to FIG. 9, it was found that the electric conductivity of the samples of Examples 1 to 4 with added Cu was increased more than that of the sample of Example 5 without any added Cu and that it was significantly increased especially near room temperature. The samples of Examples 1 to 4 had the electric conductivity (electric resistivity) that could be used as the thermoelectric material and showed it was temperature dependent. In addition, focusing on the electric conductivity at room temperature, the electric conductivity could be increased up to about $5\times10^4$ $(\Omega m)-1$ at room temperature by controlling the amount of added Cu. In FIGS. 16 to 27, the sintering temperatures are shown by the numerals in degrees Celsius; 700 in FIGS. 16 to 21 indicate Example 6, 750 indicate Example 7, 700 in FIGS. 22 to 27 indicate Example 8, 750 indicate Example 9, and 800 indicate Example 10. According to FIG. 16, the electric conductivity is slightly higher at higher sintering temperatures, and similarly, according to FIG. 22, the electric conductivity is slightly higher at higher sintering temperatures.

Figure 10:
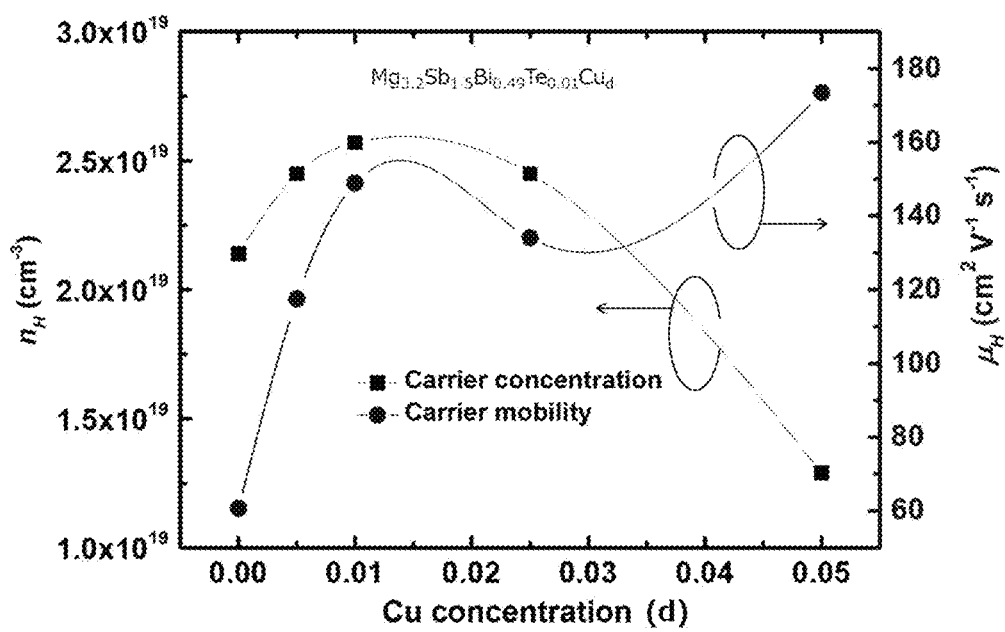
FIG. 10 shows a diagram showing dependence of carrier concentration and mobility of the samples of Examples 1 to 5 on the amount of added Cu.

FIG. 10 shows a diagram showing the dependence of carrier concentration and mobility on the amount of added Cu of the samples of Examples 1 to 5.

According to FIG. 10, it was shown that the carrier concentration and mobility also tended to increase with an increase of the amount of added Cu. In particular, focusing on the mobility, a mobility exceeding 100 $cm^2V^{-1}s^{-1}$ was obtained with the addition of Cu. It is considered that this is because the scattering mechanism of carriers by the interstitial solid solution of Cu became more advantageous.

Figure 11:
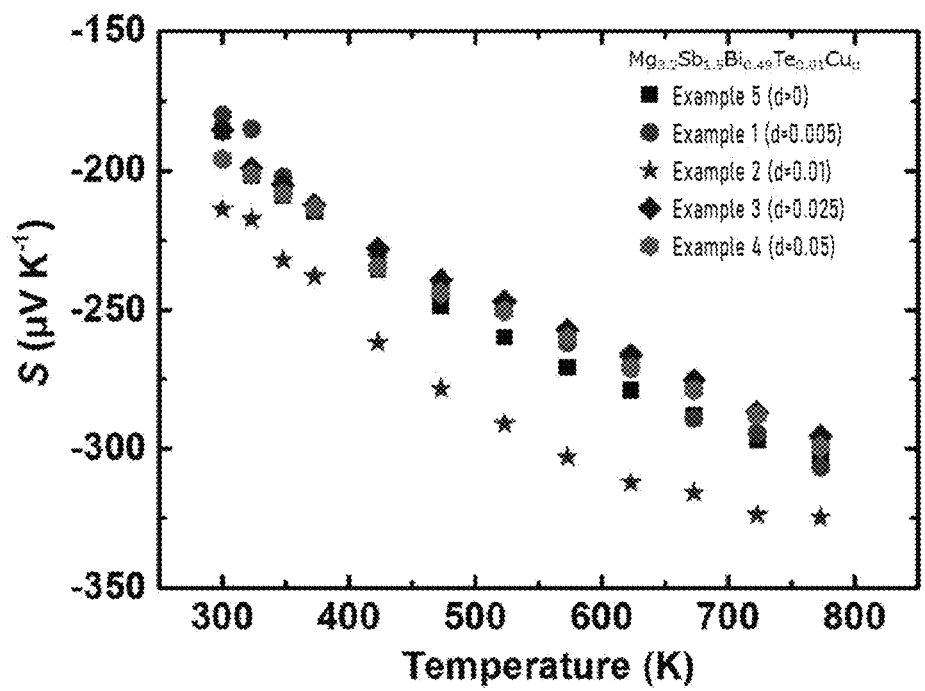
FIG. 11 shows a diagram showing a temperature dependence of Seebeck coefficient of the samples of Examples 1 to 5.
Figure 17:
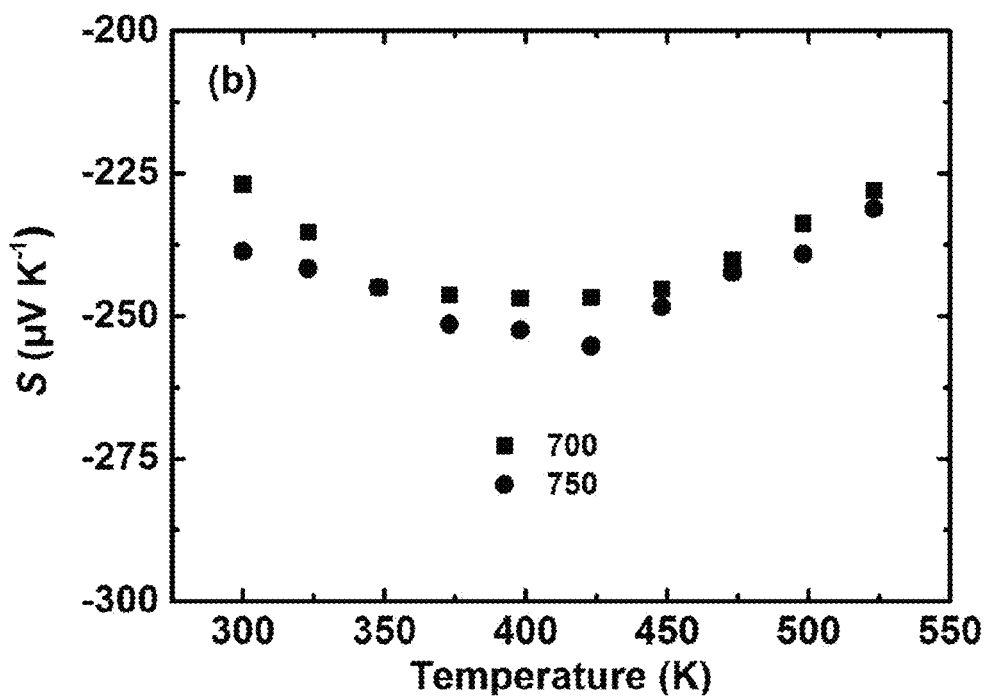
FIG. 17 shows a diagram showing a temperature dependence of Seebeck coefficient of the samples of Examples 6 to 7.
Figure 23:
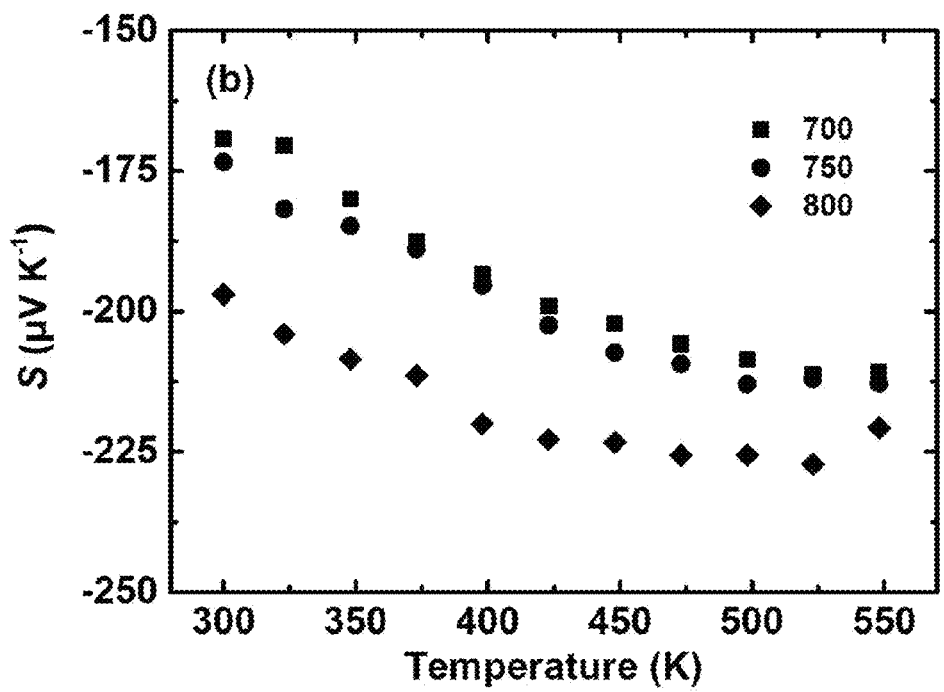
FIG. 23 shows a diagram showing a temperature dependence of Seebeck coefficient of the samples of Examples 8 to 10.

FIGS. 11, 17, and 23 show diagrams showing the temperature dependence of Seebeck coefficients of the samples of Examples 1 to 5, 6 to 7, and 8 to 10.

According to FIG. 11, it was confirmed that all the samples were of n-type conduction with large Seebeck coefficients of absolute values at least 170 μV/K. Surprisingly, although the electric conductivity was increased by the addition of Cu, the magnitude of the Seebeck coefficient was not compromised. According to FIG. 17, it was confirmed that both samples were of n-type conduction with large Seebeck coefficients of absolute values at least 220 μV/K. According to FIG. 23, it was confirmed that all the samples were of n-type conduction with large Seebeck coefficients of absolute values at least 160 μV/K.

Figure 12:
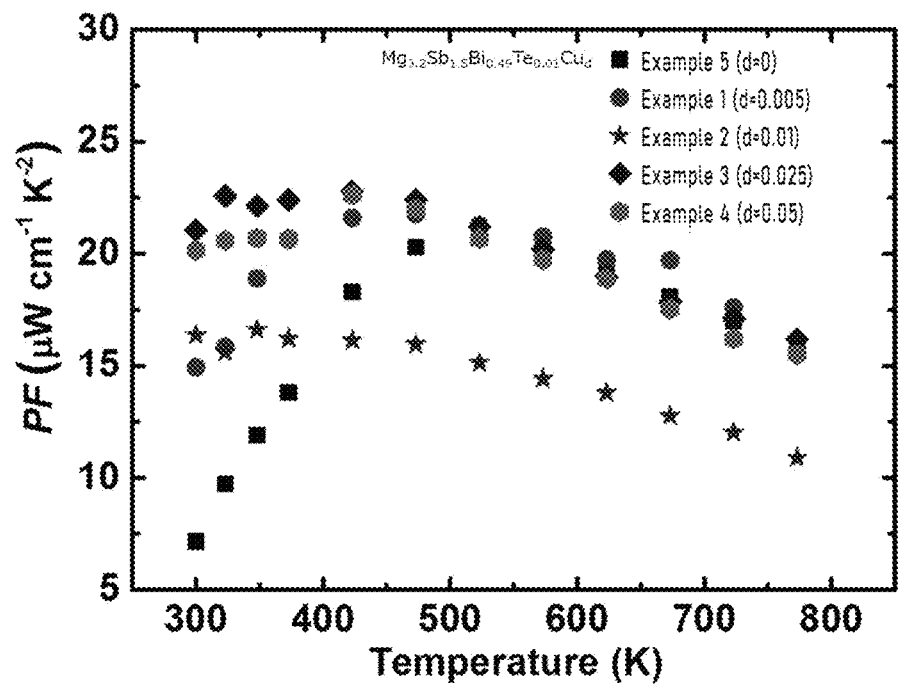
FIG. 12 shows a diagram showing a temperature dependence of an electrical output factor of the samples of Examples 1 to 5.
Figure 18:
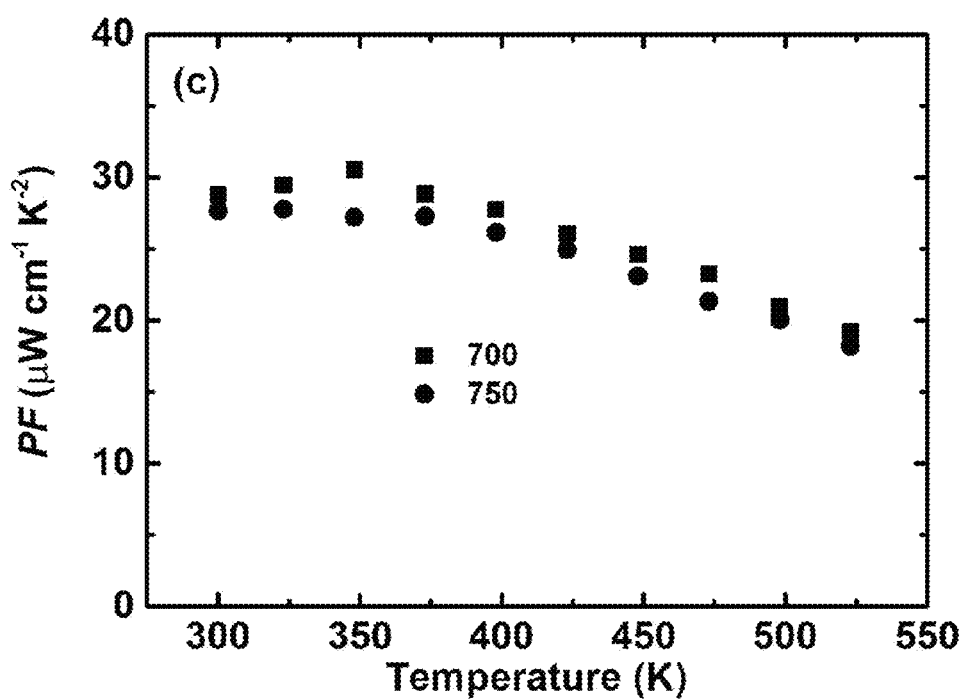
FIG. 18 shows a diagram showing a temperature dependence of an electrical output factor of the samples of Examples 6 to 7.
Figure 24:
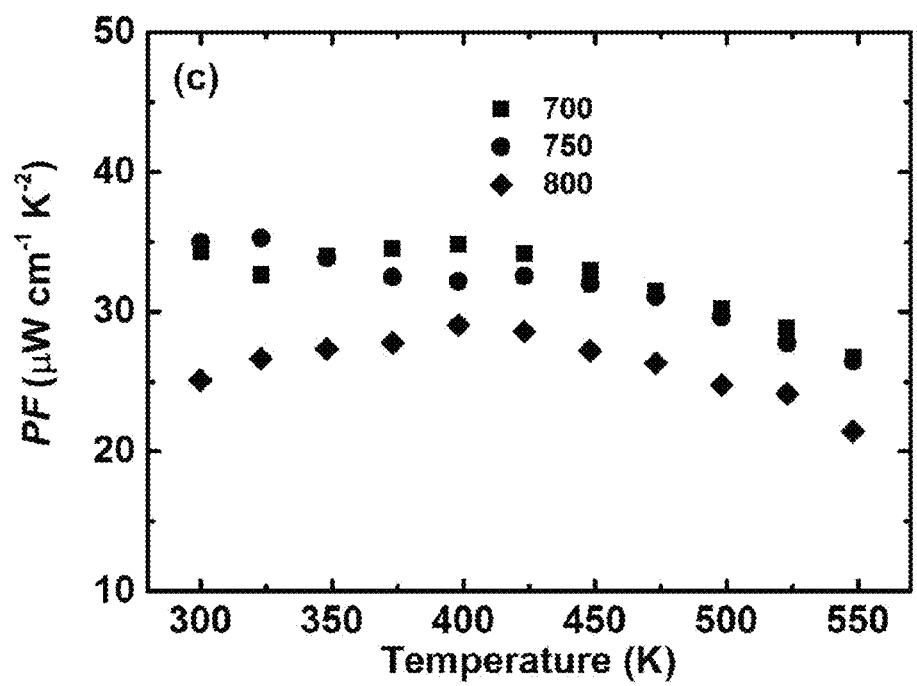
FIG. 24 shows a diagram showing a temperature dependence of the electrical output factor of the samples of Examples 8 to 10.

FIG. 12 shows a diagram showing the temperature dependence of the electrical output factor of the samples of Examples 1 to 5. FIG. 18 shows a diagram showing the temperature dependence of the electrical output factor of the samples of Examples 6 to 7. FIG. 24 shows a diagram showing the temperature dependence of the electrical output factor of the samples of Examples 8 to 10.

According to FIG. 12, it was found that the electrical output factor (power factor) of the Cu-doped samples of Examples 1 to 4 dramatically was increased in the low temperature range of 300 K to 400 K, as compared to that of the sample of Example 5 without any added Cu. For example, comparing the electrical output factor (21.03 $\mu Wcm^{-1}K^{-2}$) of the sample of Example 2 at room temperature (300 K) to the electrical output factor (7.16 $\mu Wcm^{-1}$ $K^{-2}$) of the sample of Example 5, the former was about three (3) times. From the above, the thermoelectric power generation element may be provided since it is said to be suitable for various kinds of thermoelectric cooling applications and for recovering poor heat as a power source for IoT operation. According to FIGS. 18 and 24, the results are similar to those of Examples 1 to 4.

Figure 13:
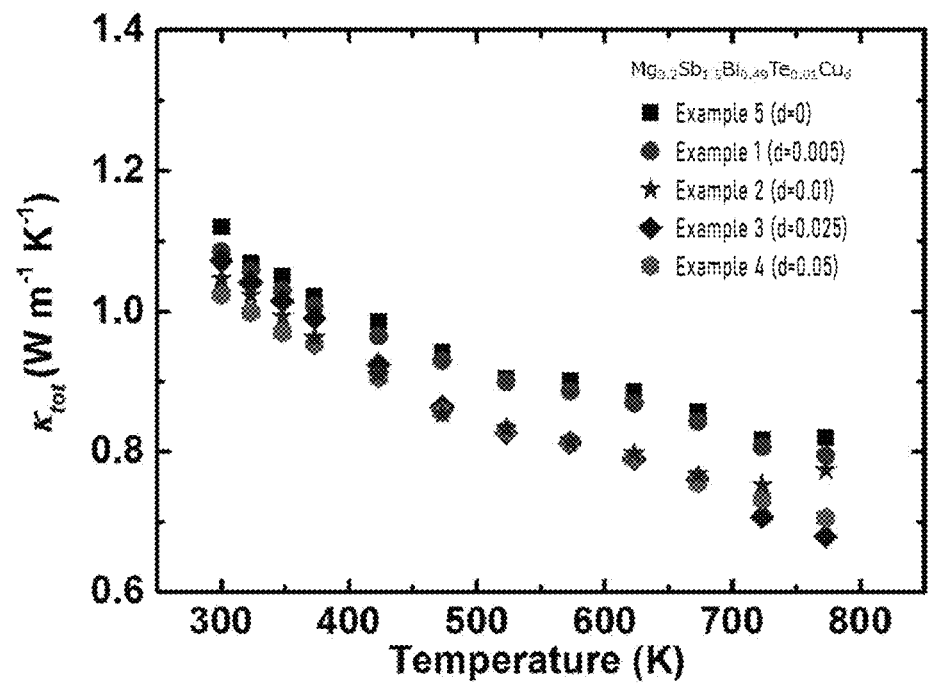
FIG. 13 shows a diagram showing a temperature dependence of total thermal conductivity of the samples of Examples 1 to 5.
Figure 19:
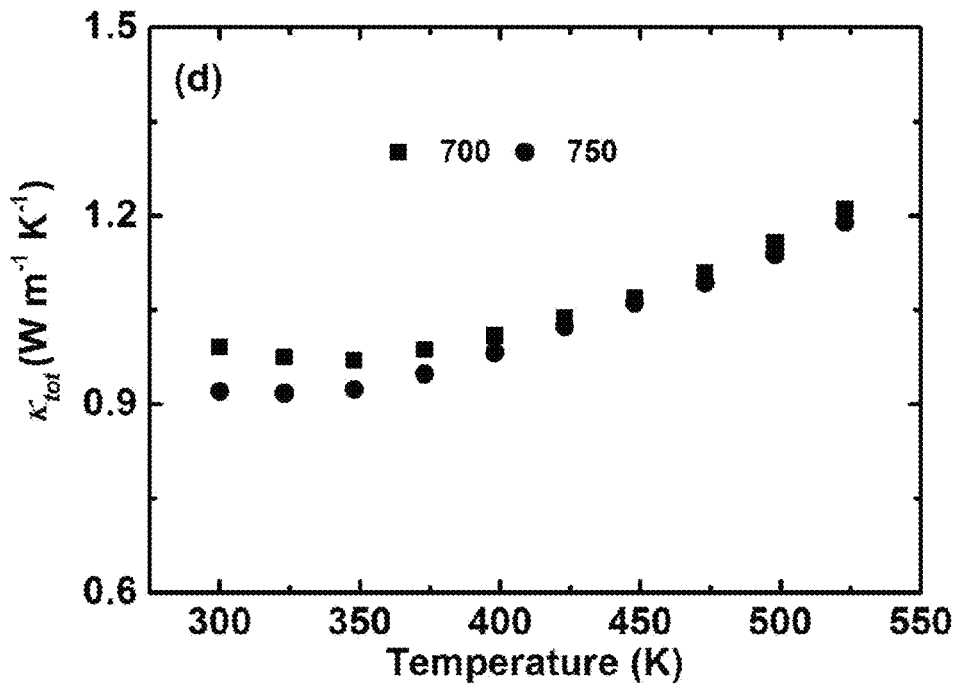
FIG. 19 shows a diagram showing a temperature dependence of a total thermal conductivity of the samples of Examples 6 to 7.
Figure 25:
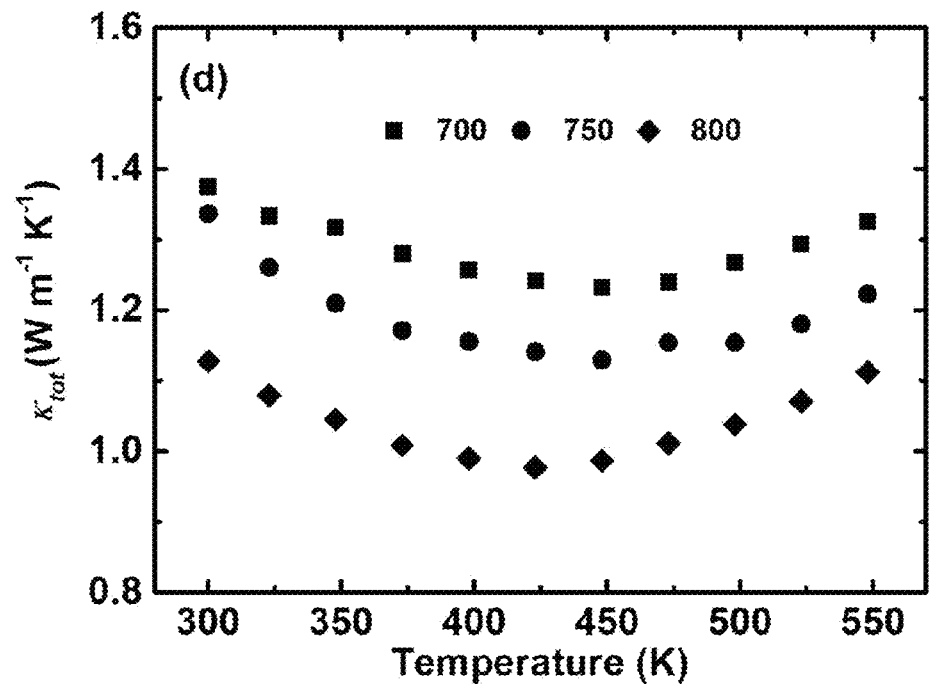
FIG. 25 shows a diagram showing a temperature dependence of the total thermal conductivity of the samples of Examples 8 to 10.

FIG. 13 shows a diagram showing the temperature dependence of the total thermal conductivity of the samples of Examples 1 to 5. FIG. 19 shows a diagram showing the temperature dependence of the total thermal conductivity of the samples of Examples 6 to 7. FIG. 25 shows a diagram showing the temperature dependence of the total thermal conductivity of the samples of Examples 8 to 10.

Figure 14:
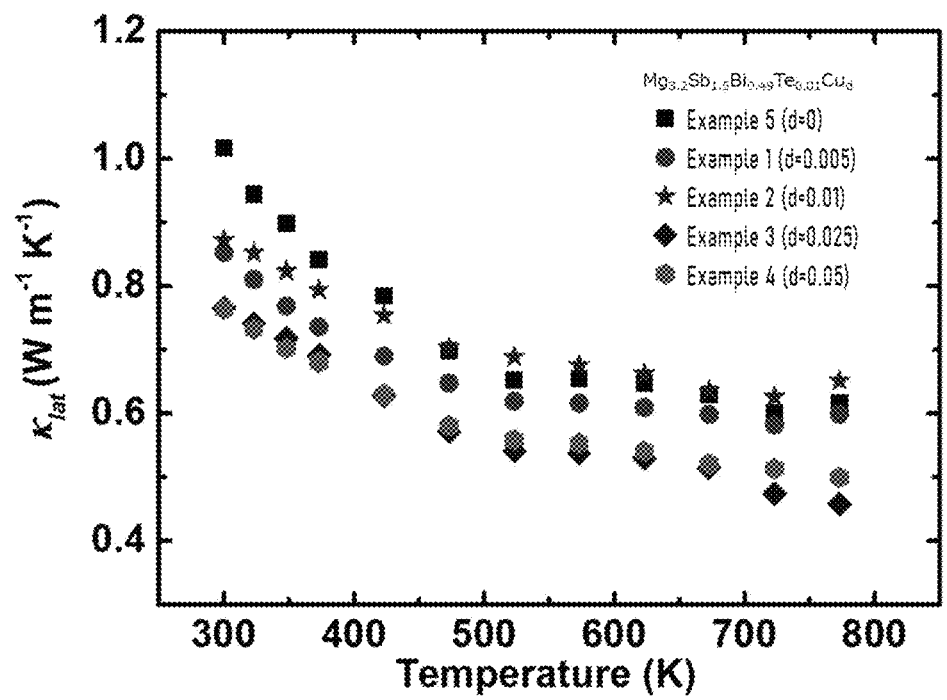
FIG. 14 shows a diagram showing a temperature dependence of lattice thermal conductivity of the samples of Examples 1 to 5.
Figure 20:
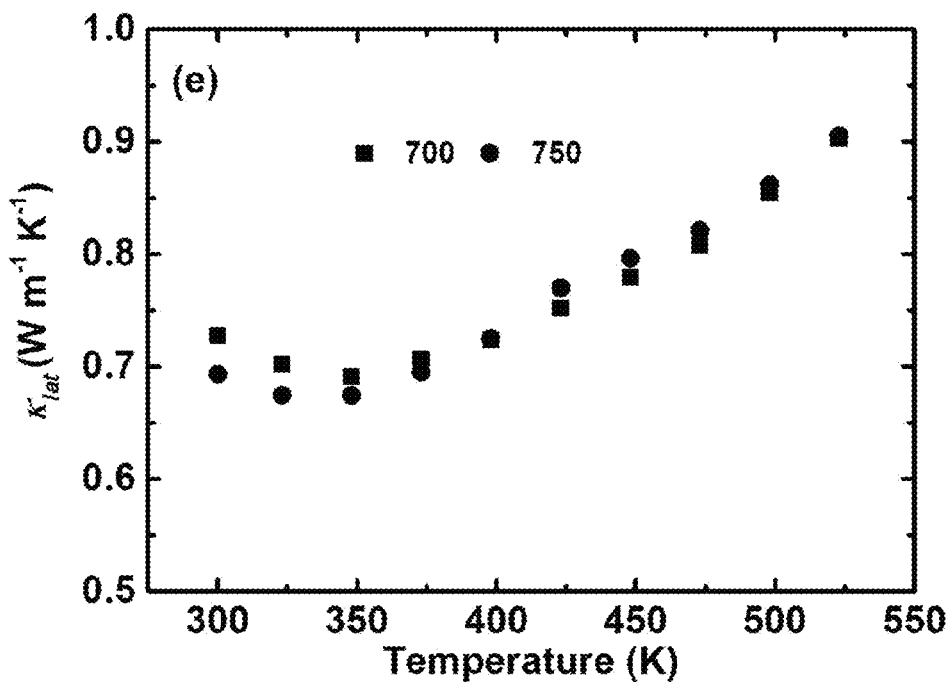
FIG. 20 shows a diagram showing a temperature dependence of the lattice thermal conductivity of the samples of Examples 6 to 7.
Figure 26:
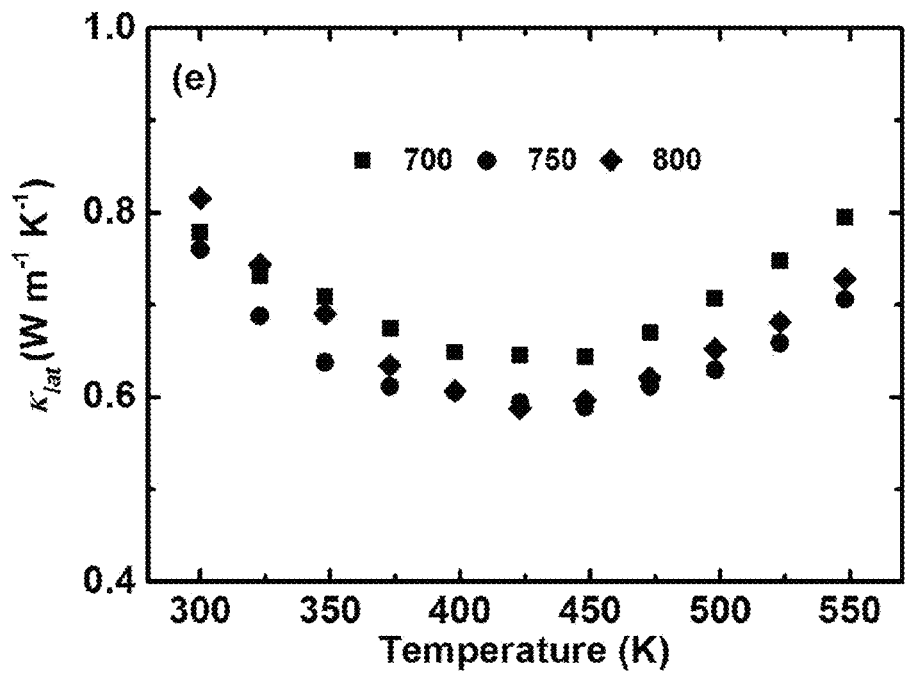
FIG. 26 shows a diagram showing a temperature dependence of the lattice thermal conductivity of the samples of Examples 8 to 10.

FIG. 14 shows a diagram showing the temperature dependence of the lattice thermal conductivity of the samples of Examples 1 to 5. FIG. 20 shows a diagram showing the temperature dependence of the lattice thermal conductivity of the samples of Examples 6 to 7. FIG. 26 shows a diagram showing the temperature dependence of the lattice thermal conductivity of the samples of Examples 8 to 10.

According to FIG. 13, it was shown that the total thermal conductivity was decreased slightly with the addition of Cu. While the the Lorentz number L was calculated and the electronic thermal conductivity was subtracted from the total thermal conductivity such that the lattice thermal conductivity was obtained, as shown in FIG. 14, the lattice thermal conductivity of the samples of Examples 1 to 4 with added Cu was significantly lower than that of the sample of Example 5 without any added Cu in the relatively low temperature region not exceeding 400K. For example, comparing the lattice thermal conductivity of the sample of Example 2 with that of the sample of Example 5 in the entire temperature range measured, the lattice thermal conductivity of the sample of Example 2 was reduced by 20-30%. According to FIGS. 19 and 25 as well as FIGS. 20 and 26, similar results to those of Examples 1 to 4 were obtained.

Figure 15:
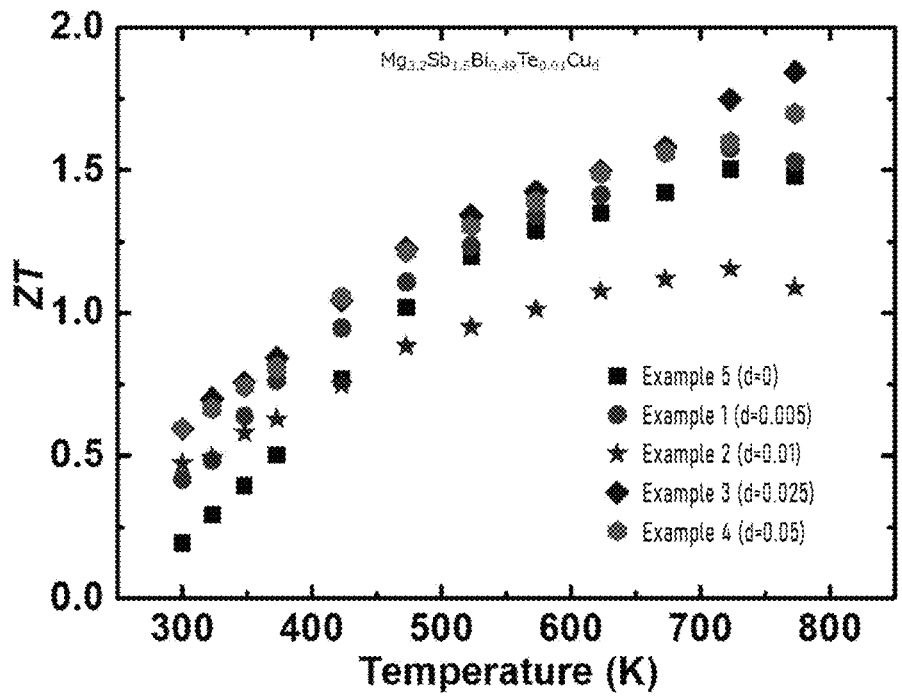
FIG. 15 shows a diagram showing a temperature dependence of a dimensionless thermoelectric figure of merit ZT of the samples of Examples 1 to 5.
Figure 21:
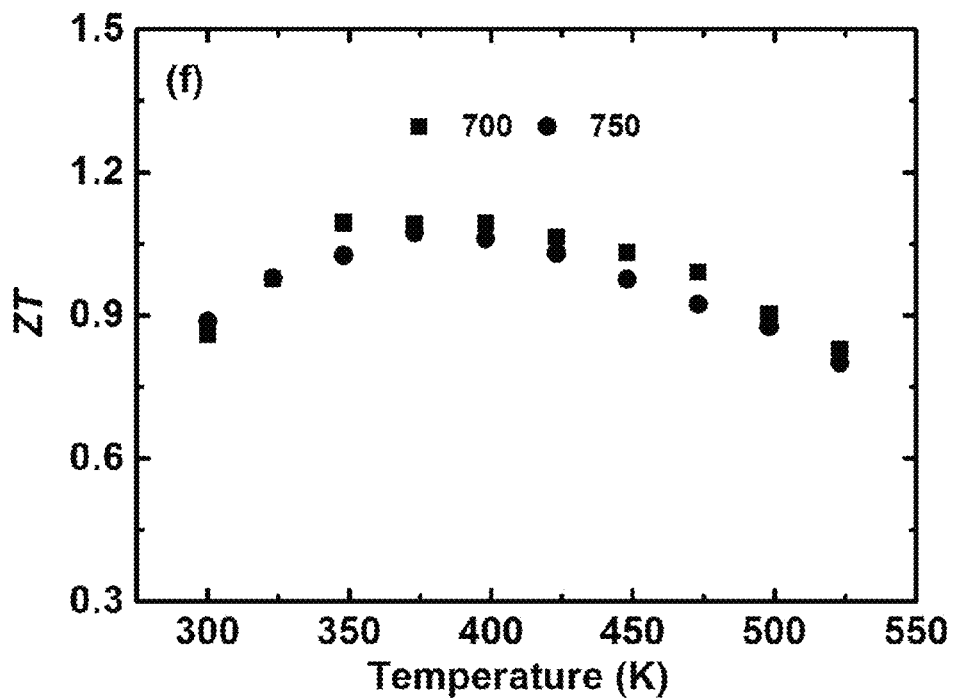
FIG. 21 shows a diagram showing a temperature dependence of the dimensionless thermoelectric figure of merit ZT of the samples of Examples 6 to 7.
Figure 27:
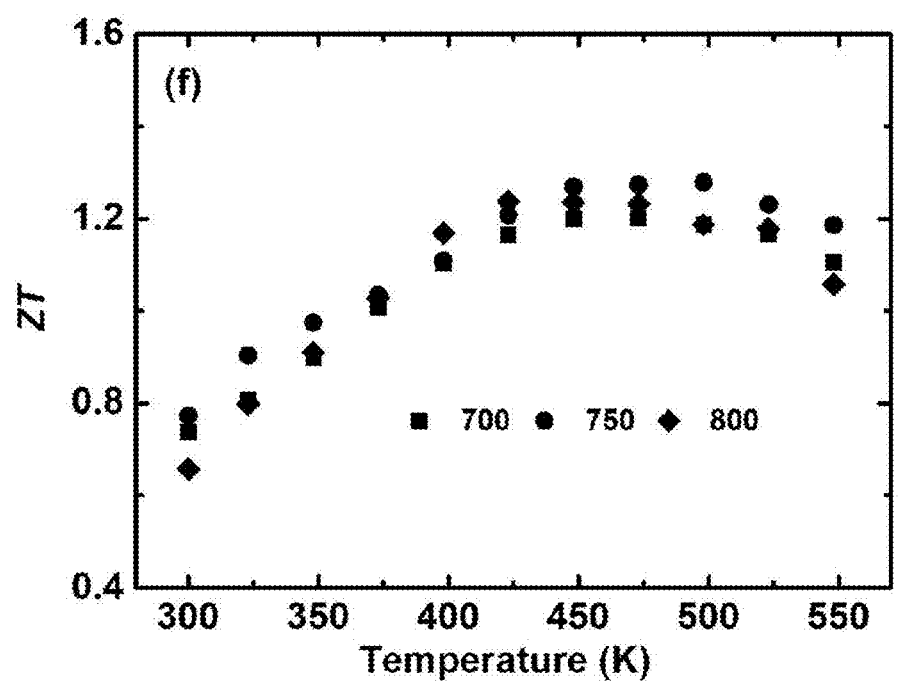
FIG. 27 shows a diagram showing a temperature dependence of dimensionless thermoelectric figure of merit ZT of the samples of Examples 8 to 10.

FIG. 15 shows a diagram showing the temperature dependence of the dimensionless thermoelectric figure of merit ZT of the samples of Examples 1 to 5. FIG. 21 shows a diagram showing the temperature dependence of the dimensionless thermoelectric figure of merit ZT of the samples of Examples 6 to 7. FIG. 27 shows a diagram showing the temperature dependence of the dimensionless thermoelectric figure of merit ZT of the samples of Examples 8 to 10.

According to FIG. 15, it was found that the ZT of the samples of Examples 1 to 4 with added Cu was increased more than that of the sample of Example 5 without any added Cu. In particular, it was found that the samples of Examples 1 to 4 with added Cu showed this tendency in the relatively low temperature region not exceeding 400 K and high values thereof equal to or higher than 0.4 could be achieved at room temperature. In the high temperature region above 400 K, it was confirmed that the original ZT of $Mg_3Sb_2$ was also substantially maintained by the addition of Cu. According to FIGS. 21 and 27, similar results were obtained to those of Examples 1 to 4.

The above thermoelectric properties are summarized in Table 3. In Table 3, "E" represents a power of 10.

TABLE 3

Lists of thermoelectric properties at room temperature (300 K) of samples of Examples 1-10

| Example | Cu d | Electric resistivity α (Ωm) | Electric conductivity (Sm$^{-1}$) | Thermal conductivity $\kappa_{tot}$ (Wm$^{-1}$k$^{-1}$) | Thermal conductivity $\kappa_{lat}$ (Wm$^{-1}$K$^{-1}$) | Seebeck coefficient S (μVK$^{-1}$) | Power factor PF (μWcm$^{-1}$K$^{-2}$) | Dimensionless figure of merit ZT |
|---|---|---|---|---|---|---|---|---|
| 1 | 0.005 | 2.17E-05 | 4.61E+04 | 1.08 | 0.85 | -180.00 | 14.93 | 0.42 |
| 2 | 0.01 | 1.63E-05 | 6.12E+04 | 1.07 | 0.77 | -185.35 | 21.03 | 0.59 |
| 3 | 0.025 | 1.90E-05 | 5.26E+04 | 1.02 | 0.76 | -195.81 | 20.15 | 0.60 |
| 4 | 0.05 | 2.79E-05 | 3.58E+04 | 1.05 | 0.87 | -213.90 | 16.38 | 0.47 |
| 5 | 0 | 4.81E-05 | 2.08E+04 | 1.12 | 1.02 | -185.71 | 7.16 | 0.19 |
| 6 | 0.01 | 1.79E-05 | 5.60E+04 | 0.99 | 0.73 | -226.86 | 28.82 | 0.86 |
| 7 | 0.01 | 2.06E-05 | 4.86E+04 | 0.92 | 0.69 | -238.64 | 27.67 | 0.89 |
| 8 | 0.01 | 8.35E-06 | 1.20E+05 | 1.38 | 0.78 | -169.24 | 34.29 | 0.74 |
| 9 | 0.01 | 8.59E-06 | 1.16E+05 | 1.34 | 0.76 | -173.43 | 35.00 | 0.77 |
| 10 | 0.01 | 1.55E-05 | 6.47E+04 | 1.13 | 0.82 | -197.26 | 25.12 | 0.66 |

According to Table 3, it was found that the samples of Examples 1 to 4 with added Cu had large electrical conductivity and improved thermoelectric figure of merit at room temperature. It was shown that the amount of added Cu (d value) was preferable in the range of 0.005≤d≤0.05, in particular, in the range of 0.005≤d≤0.025. And, in Examples 6 to 10, the room temperature power factor formed by the Seebeck coefficient and the electric conductivity was larger and enhanced compared to Examples 1 to 5. This is because, in Examples 6 to 10, the composition ratio of Bi was increased compared to Sb (see Table 1) such that the band gap became smaller and the particularly high electrical conductivity was obtained without compromising so much the Seebeck coefficient at room temperature. And, the total thermal conductivity was high, but the lattice thermal conductivity was relatively low. In general, it is said that the heat conduction is composed of heat transfer due to the transfer of heat associated with the movement of charged particles such as electrons and heat transfer due to the transfer of lattice vibration without the movement of such particles. In thermoelectric elements where voltage is generated based on the temperature differences, it is said that it is preferable that the thermal conductivity is low and the electric conductivity is high. That is, it is considered that this preferred condition was obtained in Examples 6 to 10. For example, considering the power factor, it is preferable that a larger composition ratio of Bi than that of Sb, more preferable that b>1, still more preferable that b≥1.2, and yet more preferable that b≥1.4.

INDUSTRIAL APPLICABILITY

In an embodiment of the present invention, the thermoelectric material has excellent thermoelectric performance especially near room temperature, and can serve as an alternative material to the $Bi_2Te_3$-based material, and is used in the thermoelectric cooling device and the power generation device for various electric equipment. In particular, if thinning is conducted, flexible thermoelectric power generation element can be provided as an IoT power source.

EXPLANATION OF NUMERALS

200 thermoelectric power generation element
210 n-type thermoelectric material
220 p-type thermoelectric material
230, 240 electrodes

What is claimed is:

1. A thermoelectric material comprising an inorganic compound comprising: magnesium (Mg), antimony (Sb) and/or bismuth (Bi), copper (Cu), and optionally M wherein M is at least one kind of element selected from a group consisting of selenium (Se) and tellurium (Te), wherein the inorganic compound is represented by $Mg_aSb_{2-b-c}Bi_bM_cCu_d$ and the parameters a, b, c and d satisfy:

3≤a≤3.5,

0≤b≤2,

0≤c≤0.06,

0<d≤0.1, and b+c≤2; and wherein the thermoelectric material is in a form of a powder or a sintered body, and the inorganic compound comprises crystal grains having an average grain diameter in a range of at least 3.5 μm and not exceeding 30 μm.

2. The thermoelectric material according to claim 1 wherein the parameter d satisfies:

0.005≤d≤0.05.

3. The thermoelectric material according to claim 1 wherein the parameters a, b, c, and d satisfy:

3≤a≤3.5, 0.2≤b≤0.7,

0≤c≤0.06, and 0.005≤d≤0.05.

4. The thermoelectric material according to claim 3 wherein the inorganic compound comprises a $La_2O_3$-type structure and a symmetry of a space group P-3m1.

5. The thermoelectric material according to claim 1 wherein the inorganic compound comprises a $La_2O_3$-type structure and a symmetry of a space group P-3m1.

6. The thermoelectric material according to claim 5 wherein the Cu is solid-solved interstitially in the $La_2O_3$-type structure.

7. The thermoelectric material according to claim 1 wherein the thermoelectric material is n-type.

8. The thermoelectric material according to claim 1 wherein the inorganic compound comprises crystal grains having an average grain diameter in a range of at least 4 μm and not exceeding 20 μm.

9. A method of manufacturing a thermoelectric material as defined in claim 1, the method comprising the steps of:
blending a raw material including magnesium (Mg), a raw material including antimony (Sb) and/or a raw material including bismuth (Bi), a raw material including copper (Cu), and optionally a raw material including M wherein M is at least one kind of element selected from a group consisting of selenium (Se) and Tellurium (Te) and preparing a mixture thereof; and
sintering the mixture.

10. The method according to claim 9, wherein the sintering comprises spark plasma sintering.

11. The method according to claim 10, wherein the spark plasma sintering comprises sintering in a temperature range of at least 723 K and not exceeding 1173 K, under a pressure of at least 30 MPa and not exceeding 100 MPa, for a period of time of at least 1 minute and not exceeding 10 minutes.

12. The method according to claim 10, further comprising pulverizing a sintered body obtained by the sintering.

13. The method according to claim 9, further comprising pulverizing a sintered body obtained by the sintering.

14. The method according to claim 13, further comprising mixing a powder obtained by the pulverizing with an organic material.

15. A thermoelectric power generation element comprising p-type and n-type thermoelectric materials connected in series alternately, wherein the n-type thermoelectric material comprises a thermoelectric material as defined in claim 1.

16. A thermoelectric material comprising an inorganic compound comprising: magnesium (Mg), antimony (Sb) and/or bismuth (Bi), copper (Cu), and optionally M wherein M is at least one kind of element selected from a group consisting of selenium (Se) and tellurium (Te), wherein the inorganic compound is represented by $Mg_aSb_{2-b-c}Bi_bM_cCu_d$ and the parameters a, b, c and d satisfy:

$3 \leq a \leq 3.5$, $0 \leq b \leq 2$, $0 \leq c \leq 0.06$, $0 < d \leq 0.1$, and $b+c \leq 2$; and wherein the thermoelectric material is in a form of a thin film, and wherein the inorganic compound comprises crystal grains having an average grain diameter in a range of at least 3.5 μm and not exceeding 30 μm and further comprises an organic material.

17. The thermoelectric material according to claim 16 wherein the parameters a, b, c, and d satisfy:

$3 \leq a \leq 3.5$, $0.2 \leq b \leq 0.7$, $0 \leq c \leq 0.06$, and $0.005 \leq d \leq 0.05$.

18. The thermoelectric material according to claim 16 wherein the inorganic compound comprises a $La_2O_3$-type structure and a symmetry of a space group P-3m1.

19. A thermoelectric power generation element comprising p-type and n-type thermoelectric materials connected in series alternately, wherein the n-type thermoelectric material comprises a thermoelectric material as defined in claim 16.

* * * * *